(12) United States Patent
Tsubouchi et al.

(10) Patent No.: US 6,504,787 B2
(45) Date of Patent: Jan. 7, 2003

(54) SEMICONDUCTOR MEMORY DEVICE WITH REDUCED POWER CONSUMPTION DURING REFRESH OPERATION

(75) Inventors: Yayoi Tsubouchi, Hyogo (JP); Takashi Itou, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/987,836

(22) Filed: Nov. 16, 2001

(65) Prior Publication Data

US 2002/0186609 A1 Dec. 12, 2002

(30) Foreign Application Priority Data

Jun. 7, 2001 (JP) ........................................ 2001-172362

(51) Int. Cl.[7] ................................................. G11C 8/00
(52) U.S. Cl. ................... 365/230.05; 365/222; 365/194
(58) Field of Search ............................ 365/230.03, 222, 365/194, 230.06, 233, 189.07

(56) References Cited

U.S. PATENT DOCUMENTS 5,999,471 A 12/1999 Choi
6,333,888 B1 * 12/2001 Nakazawa ................... 365/201

FOREIGN PATENT DOCUMENTS

JP 10-188562 7/1998

* cited by examiner

*Primary Examiner*—David Lam
(74) *Attorney, Agent, or Firm*—McDermott, Will & Emery

(57) ABSTRACT

A row-related control circuit is provided which changes for a normal read operation and for refresh operation the delay time from a time at which a word line is activated to a time at which a sense amplifier is activated. Even when the refresh period is made longer and the charges in a memory cell are reduced, the sensitivity of the sense amplifier is heightened so that the refresh operation becomes possible. Thus, power consumption can be reduced by prolonging the refresh intervals.

17 Claims, 18 Drawing Sheets

SEMICONDUCTOR MEMORY DEVICE WITH REDUCED POWER CONSUMPTION DURING REFRESH OPERATION

BACKGROUND OF THE INVENTION

1. Field of the Invention

The present invention relates to a semiconductor memory device, and more specifically, to a dynamic random access memory (DRAM) that allows reduction in power consumption during a refresh operation.

2. Description of the Background Art

FIG. 15 is a block diagram representing an arrangement of a control circuit 508 for performing a role activation timing control in a conventional synchronous DRAM.

Referring to FIG. 15, control circuit 508 receives control signals int.ZRAS, int.ZCAS, int.ZWE, and int.ZCS and internal bank address signals int.BA<0:1>, and outputs row address decode signals RADE<0:3>, word line trigger signals RXT<0:3>, sense amplifier activating signals S0N<0:3>, and an internal address Q for refresh operation. In addition, a prefix "Z" indicates that the signal is an L-active signal, i.e. a signal whose active state is at the low level.

Control circuit 508 includes a command decode circuit 552 for receiving control signals int.ZRAS, int. ZCAS, int.ZWE, and int.ZCS and detecting a command from a combination of these signals, and a refresh control unit 554 for performing refresh control according to an output from command decode circuit 552.

Control circuit 508 further includes a bank selecting unit 556 for selecting the output of command decode circuit 552 according to internal bank address signals int.BA<0:1>, and a bank selecting unit 560 for selecting an output of refresh control unit 554 according to internal bank address signals int.BA<0:1>.

Control circuit 508 further includes an NOR circuit 558 for receiving signals ACT<0:3> output from bank selecting unit 556 and signals AREF<0:3> output from bank selecting unit 560 and outputting signals ZRASE<0:3>, and a control circuit 562 for outputting row address decode signals RADE<0:3>, word line trigger signals RXT<0:3>, and sense amplifier activating signals S0N<0:3> according to signals AREF<0:3> and signals ZRASE<0:3>.

Command decode circuit 552 includes an active command decoder 572 for receiving control signals int.ZRAS, int.ZCAS, int.ZWE, and int.ZCS to detect an active command, an auto-refresh command decoder 574 for receiving control signals int.ZRAS, int.ZCAS, int.ZWE, and int.ZCS to detect an auto-refresh command, and a self-refresh command decoder 576 for receiving control signals int.ZRAS, int.ZCAS, int.ZWE, and int.ZCS to detect a self-refresh command.

Refresh control unit 554 includes a self-refresh timer 580 for activating a signal RINGOUT at certain intervals according to a signal SREF output from self-refresh command decoder 576, a refresh operation control circuit 582 for outputting a signal AREFS according to an output from auto-refresh command decoder 574 and a signal RINGOUT, a 1 shot pulse generating circuit 584 for outputting a signal REFA according to signal AREFS, and an internal address counter 586 for counting internal address Q during a refresh operation according to signal REFA.

Control circuit 562 includes a row-related control circuit 564 for outputting a row address decode signal RADE<0>, a word line trigger signal RXT<0>, and a sense amplifier activating signal S0N<0> according to a signal ZRASE<0>, a row-related control circuit 566 for outputting a row address decode signal RADE<1>, a word line trigger signal RXT<1>, and a sense amplifier activating signal S0N<1> according to a signal ZRASE<1>, a row-related control circuit 568 for outputting a row address decode signal RADE<2>, a word line trigger signal RXT<2>, and a sense amplifier activating signal S0N<2> according to a signal ZRASE<2>, and a row-related control circuit 570 for outputting a row address decode signal RADE<3>, a word line trigger signal RXT<3>, and a sense amplifier activating signal S0N<3> according to a signal ZRASE<3>.

FIG. 16 is a circuit diagram showing an arrangement of row-related control circuit 564 in FIG. 15.

Referring to FIG. 16, row-related control circuit 564 includes a signal generating unit 632 for outputting a row address decode signal RADE according to a signal ZRASE, a signal generating unit 634 for outputting a signal RXT according to a signal ZRASE and signal RADE, and a signal generating unit 636 for outputting sense amplifier activating signals S0N, /S0N according to signal RXT.

Signal generating unit 632 includes a delay stage 640 for delaying sense amplifier activating signal S0N, an inverter 638 for receiving and inverting signal ZRASE, and an OR circuit 642 for receiving outputs from delay stage 640 and inverter 638 and outputting signal RADE.

Delay stage 640 includes inverters 644 and 646 connected in series for receiving sense amplifier activating signal S0N.

Signal generating unit 634 includes an inverter 648 for receiving and inverting signal ZRASE, a delay stage 650 for receiving and delaying an output from inverter 648, a delay stage 652 for delaying signal RADE, and an AND circuit 654 for receiving outputs from delay stages 650 and 652 and outputting signal RXT.

Delay stage 650 includes inverters 656 and 658 connected in series for receiving the output from inverter 648. Delay stage 652 includes inverters 660 and 662 connected in series for receiving signal RADE.

Signal generating unit 636 includes a delay stage 664 for receiving and delaying signal RXT and outputting sense amplifier activating signal S0N, and an inverter 676 for receiving and inverting sense amplifier activating signal S0N and outputting sense amplifier activating signal /S0N.

Delay stage 664 includes inverters 678 and 680 connected in series for receiving signal RXT.

FIG. 17 is a circuit diagram representing the arrangement of auto-refresh command decoder 574 and refresh operation control circuit 582 in FIG. 15.

Referring to FIG. 17, auto-refresh command decoder 574 includes an inverter 692 for receiving and inverting a signal int.ZRAS, an inverter 694 for receiving and inverting a signal int.ZCAS, and an NAND circuit 696 for receiving outputs from inverters 692 and 694 and a signal int.ZWE.

Refresh operation control circuit 582 receives an output from NAND circuit 696 at a node N11.

Refresh operation control circuit 582 includes an inversion delay circuit 698 having an input connected to node N11 and an output connected to a node N13, an NOR circuit 700 having one input connected to node N11, the other input connected to node N13, and an output connected to a node N12, and an NOR circuit 702 for receiving signal RINGOUT and an output from NOR circuit 700. Inversion delay circuit 698 includes inverters 710, 712, and 714 connected in series.

Refresh operation control circuit 582 further includes a latch circuit 704 having the data set according to an output of NOR circuit 702, a delay stage 706 for delaying an output from latch circuit 704, and an inverter 708 for inverting an output from delay stage 706.

Latch circuit 704 includes an NAND circuit 716 having one input receiving the output from NOR circuit 702 and the other input connected to a node N15 for outputting a signal AREFS, and an NAND circuit 718 having one input receiving signal AREFS, the other input connected to a node N14, and an output node connected to node N15.

Delay stage 706 includes inverters 720 and 722 connected in series for receiving signal AREFS.

FIG. 18 is an operational waveform chart related to a description of an auto-refresh operation of a conventional DRAM.

Referring to FIG. 18, signals ext.ZRAS, ext.ZCAS, ext.ZWE, CKE, ext.CLK, and ext.ZCS are input signals externally supplied to the DRAM. A signal ext.ZRAS is row address strobe signal, and a signal ext.ZCAS is a column address strobe signal.

In addition, a signal AREF is an auto-refresh signal that is set to the logic high or H level during an auto-refresh operation, a signal RADE is a row address decode signal for activating a row address decoder, a signal RXT is a word line trigger signal for indicating an activation timing of a word line, a signal REFA is a clock signal for allowing counting of an address during the auto-refresh operation, and a signal Q is an address signal of a refresh operation that is internally generated. Moreover, a signal WL is a signal supplied to a word line, a signal S0N is a sense amplifier activating signal, and signals BL and ZBL are signals supplied to a bit line.

In addition, the prefix "Z" attached to a signal indicates that the signal is an L-active signal.

A command is acknowledged at time t1 at a rising edge of a clock signal ext.CLK. At time t1, signals ZCS, ext.ZRAS, and ext.ZCAS are all set to the logic low or L level, while signals ext.ZWE and CKE are set to the H level.

According to these signals, node N11 of FIG. 17 changes to the L level, and accordingly, node N12 is set to the H level. Consequently, latch circuit 704 is set so that signal AREFS is set to the H level.

Thereafter, when node N13 changes to the H level after being delayed for the delay time of inversion delay circuit 698, node N12 is accordingly set to the L level, but latch circuit 704 is still set, so that auto-refresh signal AREF is maintained at the H level.

When auto-refresh signal AREF is set to the H level, 1 shot pulse generating circuit 584 shown in FIG. 15 is rendered active and an H pulse is generated in a signal REFA. According to the H pulse generated in signal REFA, internal address counter 586 is activated, and counts one by one internal addresses Q for the refresh.

On the other hand, according to a clock edge at time t1, active command decoder 572 of FIG. 15 activates signal ACT. Accordingly, NOR circuit 558 of FIG. 15 activates signal ZRASE to the L level.

According to the change of signal ZRASE, control circuit 562 first activates signal RXT at time t1, and activates sense amplifier activating signal S0N at time t3 which is determined by an internal delay.

When signal RXT is set to the H level at time t2, a word line of the decoded address is selected, and a potential difference V0 corresponding to the data of a memory cell is generated between bit lines BL and ZBL.

At time t3, when the sense amplifier activating signal is set to the H level, a sense amplifier is activated, potential difference V0 between bit lines BL and ZBL is amplified, and a refresh operation is performed.

Then, when node N14 is set to the L level after the delay time of delay stage 706 of FIG. 17, node N15 changes to the H level, and auto-refresh signal AREF changes to the L level. Consequently, NOR circuit 558 of FIG. 15 sets signal ZRASE to the H level so that the refresh operation is terminated.

In the auto-refresh operation as described above, when a command is externally supplied, a refresh address is counted internally, and the refresh operation is performed once. Thus, there is no need to provide an address input for the refresh from outside.

Next, a self-refresh operation of the conventional DRAM will be described.

FIG. 19 is an operational waveform chart related to a description of an operation during the self-refresh operation of the conventional DRAM.

Referring to FIGS. 15 and 19, a self-refresh command is acknowledged at a rising edge of clock signal ext.CLK at time t2. The self-refresh command can be designated by setting signals ZCS, ext.ZRAS, ext.ZCAS, and CKE at the L level and setting signal ext.ZWE at the H level.

Thus, self-refresh command decoder 576 of FIG. 15 activates a signal SREF to the H level. Accordingly, self-refresh timer 580 is activated, and sets signal RINGOUT to the H level for a certain time period.

Consequently, auto-refresh signal AREF is set to the H level for a certain time period, and the refresh operation is performed as in the case described with reference to FIG. 18.

At time t3 when a certain time period has passed since signal ZRASE was set to the L level, self-refresh timer 580 sets signal RINGOUT to the L level. At time t4 when an additional time period has passed, self-refresh timer 580 sets signal RINGOUT to the H level. In this manner, signal RINGOUT is alternately set to the L level and the H level at certain intervals.

According to signal RINGOUT, auto-refresh signal AREF is set to the L level and the H level at certain intervals in a similar manner so that the refresh operation is performed automatically while the row address is successively counted.

In the self-refresh operation as described above, when a command is externally supplied, the refresh address is counted internally, and the refresh operation is performed repeatedly.

As described above, the DRAM is required to perform a refresh operation at certain intervals so as to prevent written data from being lost. The DRAM consumes power every time the refresh operation is performed.

In recent years, a large capacity memory is being mounted on a personal digital assistant and the like, and a further reduction in power consumption is demanded of a DRAM used in such products.

In the conventional DRAM, however, the row activation control is performed in a refresh operation at timing similar to that in a normal read operation so that there is a problem of large power consumption during the refresh operation.

SUMMARY OF THE INVENTION

The object of the present invention is to provide a semiconductor memory device capable of achieving reduction and power consumption during a refresh operation.

The present invention, in short, is provided with a memory block including a plurality of memory cells arranged in a matrix of rows and columns, and a control circuit.

The memory block includes a plurality of word lines corresponding to the rows, a plurality of bit line pairs corresponding to the columns, a row decode circuit for selectively activating a part of the plurality of word lines, a column decode circuit for selecting a part of the plurality of bit line pairs, and a sense amplifier circuit for amplifying data read on the plurality of bit lines.

The control circuit controls the row decode circuit and the sense amplifier circuit. The control circuit includes a command decode circuit for detecting a plurality of commands from a control signal externally supplied, and a row activation timing control unit for outputting a first activating signal that indicates an activation timing of a word line and a second activating signal that indicates an activation timing of the sense amplifier circuit according to an output from the command decode circuit.

The row activation timing control unit activates the first activating signal, and after a first delay time, activates the second activating signal when a command detected by the command decode circuit is a first command. The row activation timing control unit activates the first activating signal, and after a second delay time which is longer than the first delay time, activates the second activating signal when the command detected by the command decode circuit is a second command.

According to another aspect of the present invention, the semiconductor memory device is provided with a plurality of memory blocks and a control circuit.

Each of the plurality of memory blocks includes a plurality of memory cells arranged in a matrix of rows and columns, a plurality of word lines corresponding to the rows, a plurality of bit line pairs corresponding to the columns, a row decode circuit for selectively activating a part of the plurality of word lines, a column decode circuit for selecting a part of the plurality of bit line pairs, and a sense amplifier circuit for amplifying data read on the plurality of bit lines.

The control circuit controls the row decode circuit and the sense amplifier circuit. The control circuit includes a command decode circuit for detecting a plurality of commands from a control signal externally supplied, and a plurality of row activation timing control units for outputting a first activating signal that indicates an activation timing of a word line and a second activating signal that indicates an activation timing of the sense amplifier circuit according to an output from the command decode circuit.

Each of the plurality of row activation timing control units activates the first activating signal, and after a first delay time, activates the second activating signal when a command detected by the command decode circuit is a first command, while it activates the first activating signal, and after a time period longer than the first delay time, activates the second activating signal when the command detected by the command decode circuit is a second command.

The respective time periods from the activation of the first activating signal to the activation of the second activating signal according to the second command are different for the plurality of row activation timing control units.

Therefore, the principal advantage of the present invention is that power consumption can be reduced during an operation according to the second command.

Another advantage of the present invention lies in that, since the activation timing of the sense amplifier is shifted for the respective memory blocks, a peak value of the consumed current can be made small, thereby achieving further reduction in power consumption.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
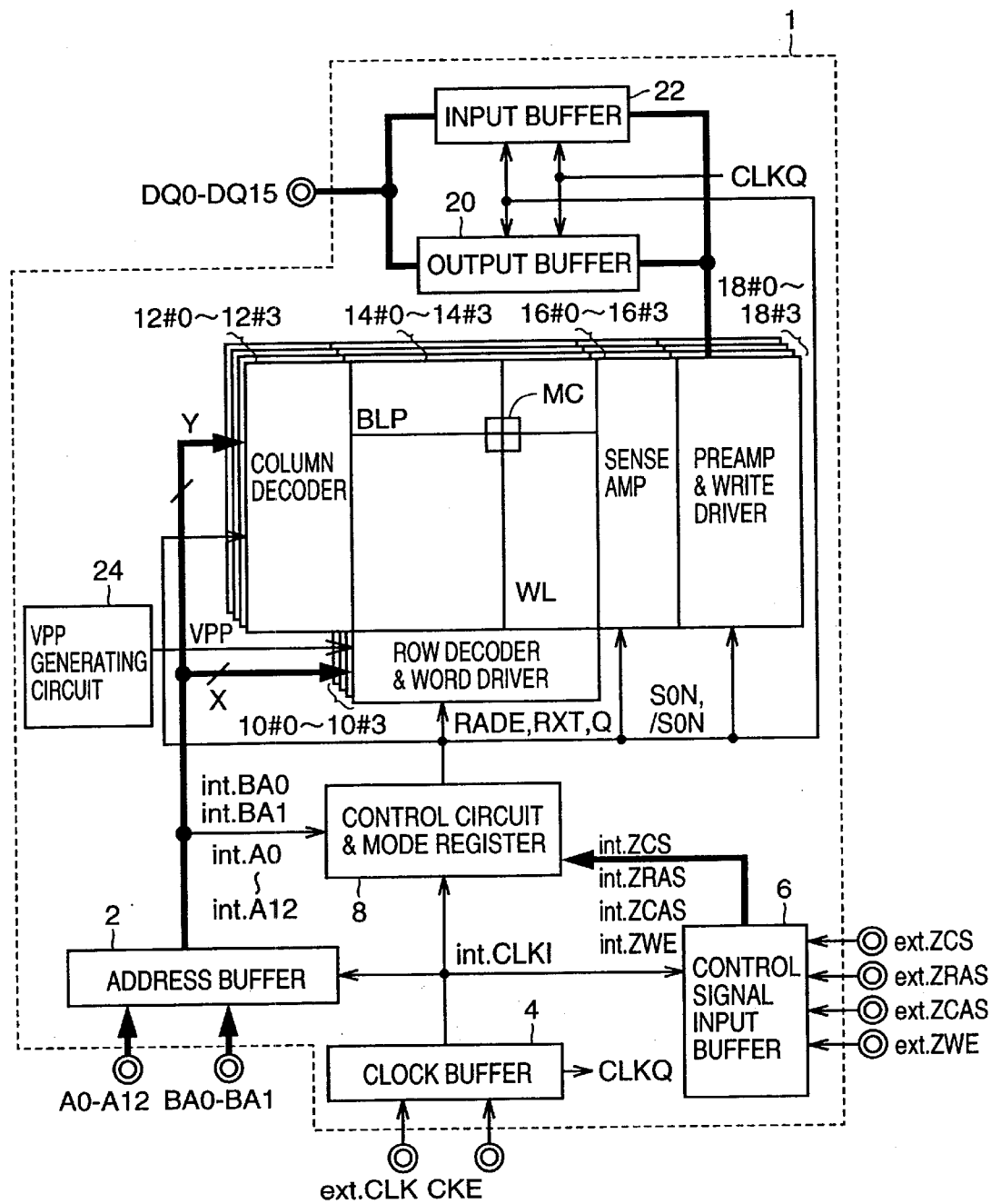
FIG. 1 is a schematic block diagram representing an arrangement of a semiconductor memory device 1 according to a first embodiment of the present invention.

The embodiments of the present invention will be described in detail below with reference to the drawings.

Throughout the drawings, the same reference characters denote the same or corresponding parts.

First Embodiment

FIG. 1 is a schematic block diagram representing the arrangement of a semiconductor memory device 1 according to the first embodiment of the present invention.

Referring to FIG. 1, semiconductor memory device 1 includes memory array banks 14#0 to 14#3, each having a plurality of memory cells arranged in a matrix of rows and columns, an address buffer 2 for taking in externally supplied address signals A0 to A12 and bank address signals BA0 and BA1 in synchronization with a clock signal int.CLKI and outputting an internal row address, an internal column address, and an internal bank address, a clock buffer 4 for receiving a clock signal CLK and a clock enable signal CKE from outside and outputting clock signals int.CLKI and CLKQ to be used inside the semiconductor memory device, and a control signal input buffer 6 for taking in the externally supplied control signals ext.ZCS, ext.ZRAS, ext.ZCAS, and ext.ZWE in synchronization with clock signal CLKI.

Each of memory array banks 14#0 to 14#3 includes memory cells MC arranged in a matrix of rows and columns, a plurality of word lines WL provided corresponding to rows of memory cells MC, and a bit line pair BLP provided corresponding to a column of memory cells MC. Bit line pair BLP includes bit lines BL and ZBL as will be described below. Memory array banks 14#0 to 14#3 can perform the read operation independently of one another.

Semiconductor memory device 1 further includes a control circuit 8 for receiving an internal address signal from address buffer 2 and control signals int.ZCS, int.ZRAS, int.ZCAS, and int.ZWE from control signal input buffer 6 which are synchronized with a clock signal and outputting control signals to each block in synchronization with clock signal int.CLKI. In FIG. 1, control circuit 8 and a mode register that holds an operation mode acknowledged by control circuit 8 are represented by one block.

Control circuit 8 includes a bank address decoder for decoding internal bank address signals int.BA0 and int.BA1, a command decoder for receiving and decoding control signals int.RAS, int.CAS, and int.WE, and a control circuit for performing the row-related timing control to be described later.

Semiconductor memory device 1 further includes a VPP generating circuit 24 for generating a potential VPP which is a high potential that activates a word line.

Semiconductor memory device 1 further includes row decoders respectively provided corresponding to memory array banks 14#0 to 14#3 for decoding a row address signal X supplied from address buffer 2 or a refresh address Q according to a row address decode signal RADE, and word drivers for driving, to a potential VPP, a row (a word line) addressed by output signals from these row decoders inside memory array banks 14#0 to 14#3 at a timing corresponding to a word line trigger signal RXT. In FIG. 1, row decoders and word drivers are together shown as blocks 10#0 to 10#3.

Semiconductor memory device 1 further includes column decoders 12#0 to 12#3 each for decoding an internal column address signal Y supplied from address buffer 2 to generate a column select signal, and sense amplifiers 16#0 to 16#3 for sensing and amplifying data of a memory cell connected to a selected row of each of memory array banks 14#0 to 14#3.

Semiconductor memory device 1 further includes an input buffer 22 for receiving write data from outside to generate internal write data, a write driver for amplifying and transmitting the internal write data from input buffer 22 to a selected memory cell, a preamplifier for amplifying data read from the selected memory cell, and an output buffer 20 for further buffering and outputting data from the preamplifier to the outside.

The preamplifier and the write driver are respectively provided corresponding to each of memory array banks 14#0 to 14#3. In FIG. 1, the preamplifier and the write driver are represented as one block in each of blocks 18#0 to 18#3.

Input buffer 22 takes in according to a clock signal CLKQ data DQ0 to DQ15 supplied to a terminal from outside.

Output buffer 20 outputs data DQ0 to DQ15 in synchronization with clock signal CLKQ when semiconductor memory device 1 outputs data to the outside.

Figure 2:
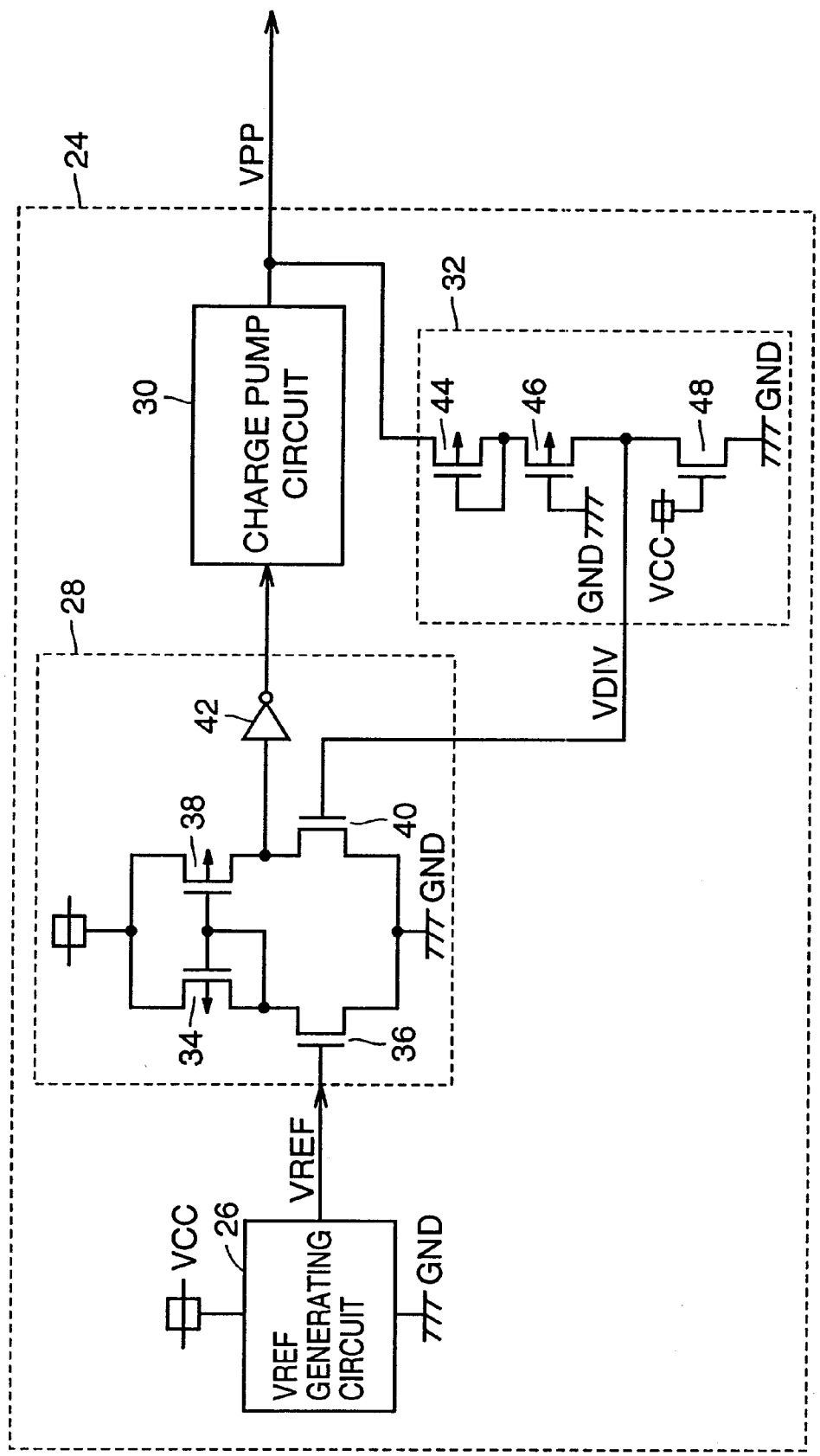
FIG. 2 is a circuit diagram showing an arrangement of a VPP generating circuit 24 in FIG. 1.

FIG. 2 is a circuit diagram representing an arrangement of VPP generating circuit 24 in FIG. 1.

Referring to FIG. 2, VPP generating circuit 24 includes a VREF generating circuit 26 for receiving a power-supply potential VCC and a ground potential GND to output a reference potential VREF, a comparing circuit 28 for comparing reference potential VREF and a divided potential VDIV, a charge pump circuit 30 for outputting a potential VPP according to an output from comparing circuit 28, and a voltage dividing circuit 32 for outputting divided potential VDIV according to potential VPP.

Comparing circuit 28 includes an N-channel MOS transistor 36 having a source coupled to a ground potential and a gate receiving reference potential VREF, a P-channel MOS transistor 34 having a gate and drain connected to a drain of N-channel MOS transistor 36 and a source coupled to power-supply potential VCC, an N-channel MOS transistor 40 having a source coupled to the ground potential and a gate receiving divided potential VDIV, a P-channel MOS transistor 38 connected between a power-supply node and a drain of N-channel MOS transistor 40 and having a gate connected to a drain of N-channel MOS transistor 36, and an inverter 42 having an input connected to the drain of N-channel MOS transistor 40.

Voltage dividing circuit 32 includes a diode-connected P-channel MOS transistor 44 having a source coupled to potential VPP, a P-channel MOS transistor 46 having a gate coupled to a ground potential and a source connected to a drain of P-channel MOS transistor 44, and an N-channel MOS transistor 48 connected between a drain of P-channel MOS transistor 46 and a ground node and having a gate coupled to a power-supply potential VCC. Divided potential VDIV is output from a drain of N-channel MOS transistor 48.

Figure 3:
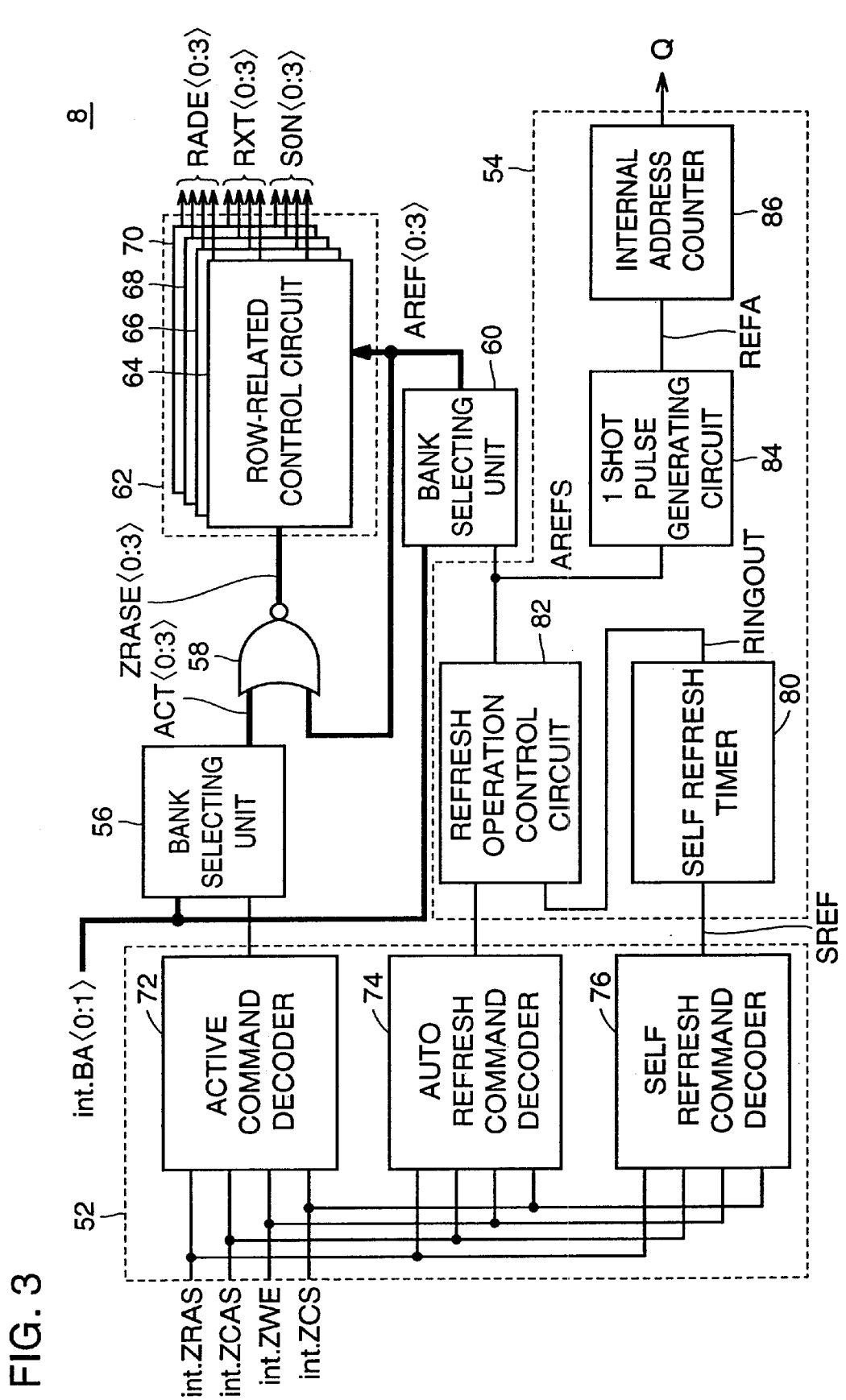
FIG. 3 is a block diagram showing an arrangement related to row activation control of a control circuit 8 in FIG. 1.

FIG. 3 is a block diagram representing an arrangement related to the row activation control of control circuit 8 in FIG. 1.

Referring to FIG. 3, control circuit 8 receives control signals int.ZRAS, int.ZCAS, int.ZWE, and int.ZCS and internal bank address signals int.BA<0:1>, and outputs row address decode signals RADE<0:3>, word line trigger signals RXT<0:3>, sense amplifier activating signals S0N<0:3>, and an internal address Q for a refresh operation. In addition, the prefix "Z" attached indicates that the signal is an L-active signal.

Control circuit 8 includes a command decode circuit 52 for receiving control signals int.ZRAS, int.ZCAS, int.ZWE, and int.ZCS to detect a command from a combination of these signals, and a refresh control unit 54 for performing refresh control according to an output from command decode circuit 52.

Control circuit 8 further includes a bank selecting unit 56 for selecting the output from command decode circuit 52 according to internal bank address signals int.BA<0:1>, and a bank selecting unit 60 for selecting an output from refresh control unit 54 according to internal bank address signals int.BA<0:1>.

Control circuit 8 further includes an NOR circuit 58 for receiving signals ACT<0:3> output from bank selecting unit 56 and signals AREF<0:3> output from bank selecting unit 60 and outputting signals ZRASE<0:3>, and a control circuit 62 for outputting row address decode signals RADE<0:3>, word line trigger signals RXT<0:3>, and sense amplifier activating signals Z0N<0:3> according to signals AREF<0:3> and signals ZRASE<0:3>.

Command decode circuit 52 includes an active command decoder 72 for receiving control signals int.ZRAS, int.ZCAS, int.ZWE, and int.ZCS to detect an active command, an auto-refresh command decoder 74 for receiving control signals int.ZRAS, int.ZCAS, int.ZWE, and int.ZCS to detect an auto-refresh command, and a self-refresh command decoder 76 for receiving control signals int.ZRAS, int.ZCAS, int.ZWE, and int.ZCS to detect a self-refresh command.

Refresh control unit 54 includes a self-refresh timer 80 for activating a signal RINGOUT at certain intervals according to a signal SREF output from self-refresh command decoder 76, a refresh operation control circuit 82 for outputting a signal AREFS according to an output from auto-refresh command decoder 74 and a signal RINGOUT, a 1 shot pulse generating circuit 84 for outputting a signal REFA according to signal AREFS, and an internal address counter 86 for counting internal address Q for a refresh operation according to signal REFA.

Control circuit 62 includes a row-related control circuit 64 for outputting a row address decode signal RADE<0>, a word line trigger signal RXT<0>, and a sense amplifier activating signal S0N<0> according to a signal ZRASE<0>, a row-related control circuit 66 for outputting a row address decode signal RADE<1>, a word line trigger signal RXT<1>, and a sense amplifier activating signal S0N<1> according to a signal ZRASE<1>, a row-related control circuit 68 for outputting a row address decode signal RADE<2>, a word line trigger signal RXT<2>, and a sense amplifier activating signal S0N<2> according to a signal ZRASE<2>, and a row-related control circuit 70 for outputting a row address decode signal RADE<3>, a word line trigger signal RXT<3>, and a sense amplifier activating signal S0N<3> according to a signal ZRASE<3>.

Figure 4:
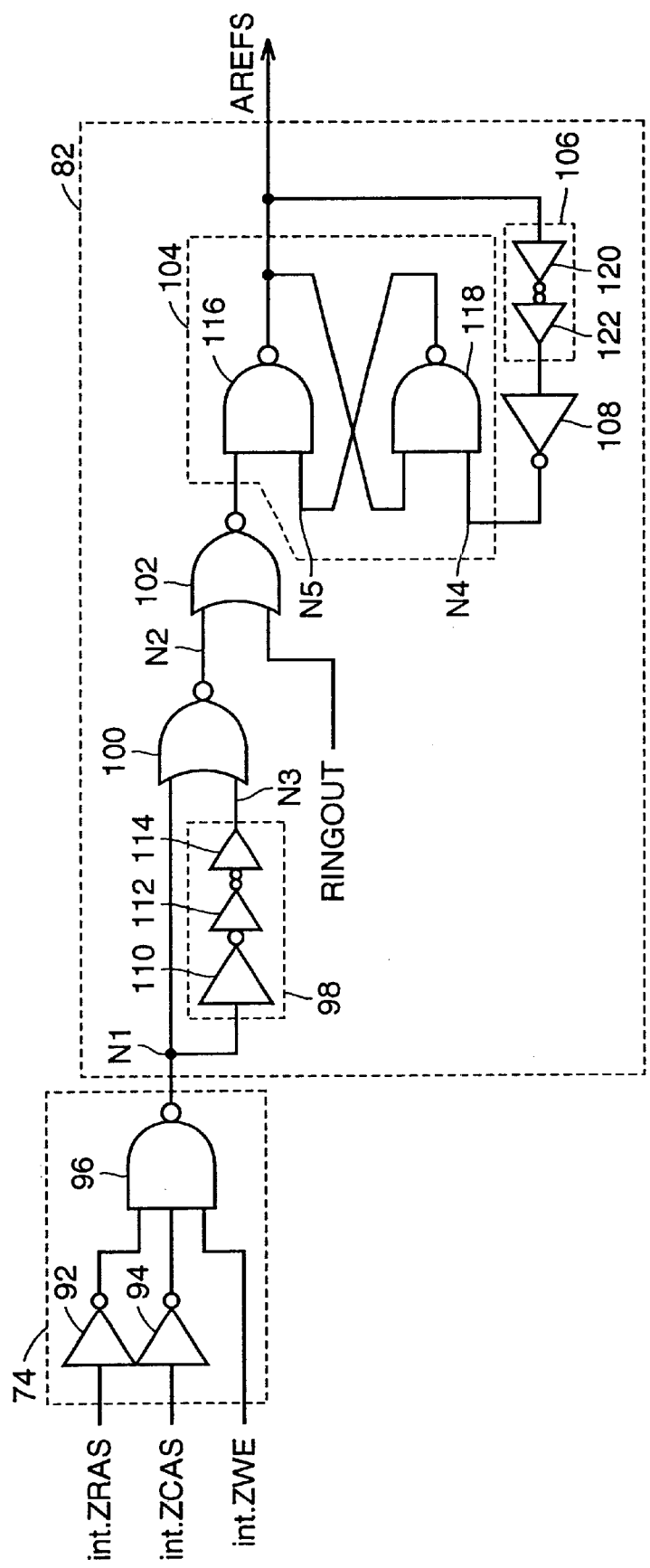
FIG. 4 is a circuit diagram showing an arrangement of an auto-refresh command decoder 74 and a refresh operation control circuit 82 in FIG. 3.

FIG. 4 is a circuit diagram representing the arrangement of auto-refresh command decoder 74 and refresh operation control circuit 82 in FIG. 3.

Referring to FIG. 4, auto-refresh command decoder 74 includes an inverter 92 for receiving and inverting a signal int.ZRAS, an inverter 94 for receiving and inverting a signal int.ZCAS, and an NAND circuit 96 for receiving outputs from inverters 92 and 94 and a signal int.ZWE.

Refresh operation control circuit 82 receives an output from NAND circuit 96 at a node N1.

Refresh operation control circuit 82 includes an inversion delay circuit 98 having an input connected to node N1 and an output connected to a node N3, an NOR circuit 100 having one input connected to node N1, the other input connected to node N3, and an output connected to a node N2, and an NOR circuit 102 for receiving signal RINGOUT and an output from NOR circuit 100. Inversion delay circuit 98 includes inverters 110, 112, and 114 connected in series.

Refresh operation control circuit 82 further includes a latch circuit 104 having the data set according to an output of NOR circuit 102, a delay stage 106 for delaying an output from latch circuit 104, and an inverter 108 for inverting an output from delay stage 106.

Latch circuit 104 includes an NAND circuit 116 having one input receiving the output from NOR circuit 102 and the other input connected to a node N5 for outputting a signal AREFS, and an NAND circuit 118 having one input receiving signal AREFS, the other input connected to a node N4, and an output node connected to node N5.

Delay stage 106 includes inverters 120 and 122 connected in series for receiving signal AREFS.

Figure 5:
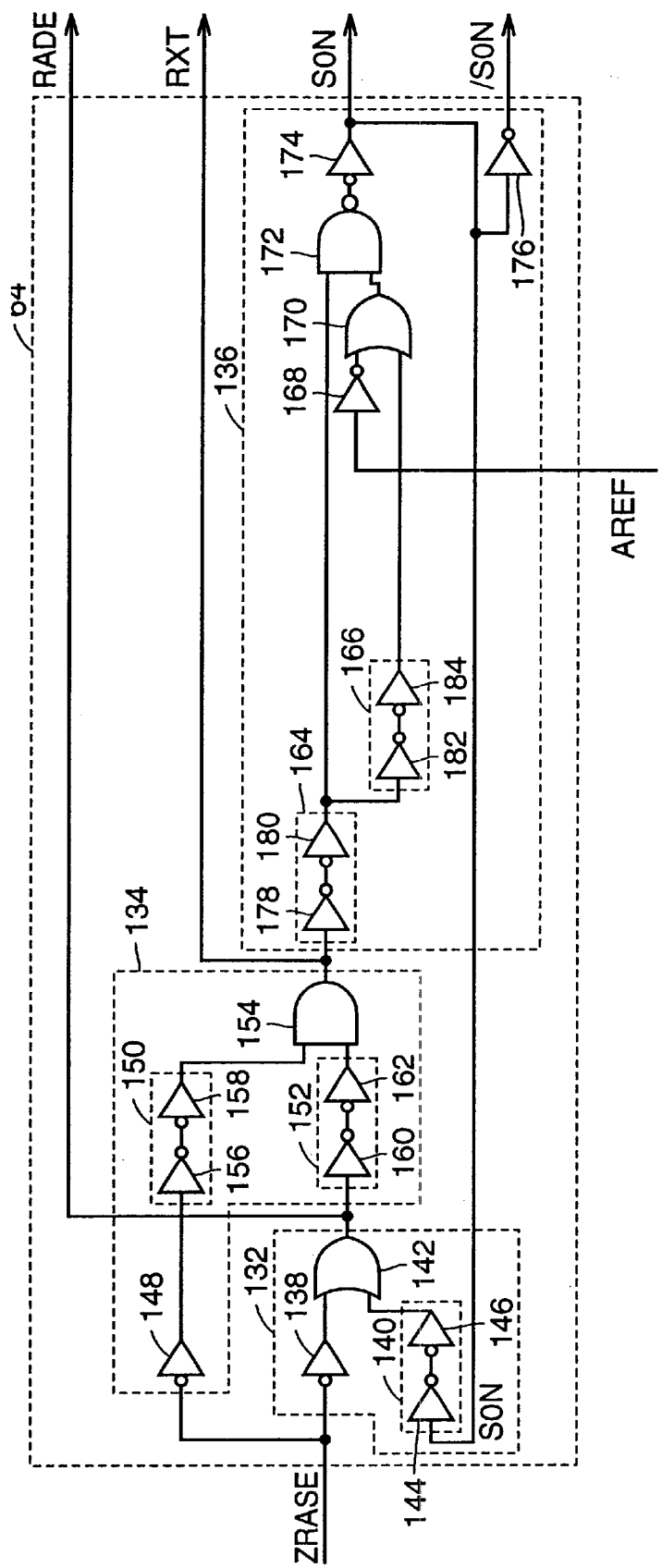
FIG. 5 is a circuit diagram representing an arrangement of a row-related control circuit 64 of FIG. 3.

FIG. 5 is a circuit diagram representing an arrangement of row-related control circuit 64 in FIG. 3.

Referring to FIG. 5, row-related control circuit 64 includes a signal generating unit 132 for outputting a row address decode signal RADE according to a signal ZRASE, a signal generating unit 134 for outputting a signal RXT according to signal ZRASE and signal RADE, and a signal generating unit 136 for outputting sense amplifier activating signals S0N, /S0N according to signal RXT.

Signal generating unit 132 includes a delay stage 140 for delaying sense amplifier activating signal S0N, an inverter 138 for receiving and inverting signal ZRASE, and an OR circuit 142 for receiving outputs from delay stage 140 and inverter 138 and outputting signal RADE.

Delay stage 140 includes inverters 144 and 146 connected in series for receiving sense amplifier activating signal S0N.

Signal generating unit 134 includes an inverter 148 for receiving and inverting signal ZRASE, a delay stage 150 for receiving and delaying an output from inverter 148, a delay stage 152 for delaying signal RADE, and an AND circuit 154 for receiving outputs from delay stages 150 and 152 and outputting signal RXT.

Delay stage 150 includes inverters 156 and 158 connected in series for receiving the output from inverter 148. Delay stage 152 includes inverters 160 and 162 connected in series for receiving signal RADE.

Signal generating unit 136 includes a delay stage 164 comprising inverters 178 and 180 for receiving and delaying signal RXT, a delay stage 166 comprising inverters 182 and 184 for further delaying an output from delay stage 164, an inverter 168 for receiving and inverting an auto-refresh signal AREF, an OR circuit 170 for receiving an output from inverter 168 and an output from delay stage 166, an NAND circuit 172 for receiving the output from delay stage 164 and an output from OR circuit 170, an inverter 174 for receiving and inverting an output from NAND circuit 172 and outputting sense amplifier activating signal S0N, and an inverter 176 for receiving and inverting sense amplifier activating signal S0N and outputting sense amplifier activating signal /S0N.

Row-related control circuit 64 further extends the time period from the activation of signal RXT to the activation of sense amplifier activating signal S0N for the delay time of delay stage 166 when auto-refresh signal AREF is active.

Next, the reason for delaying the sense amplifier activation timing in the auto-refresh operation or the self-refresh operation will be described.

Figure 6:
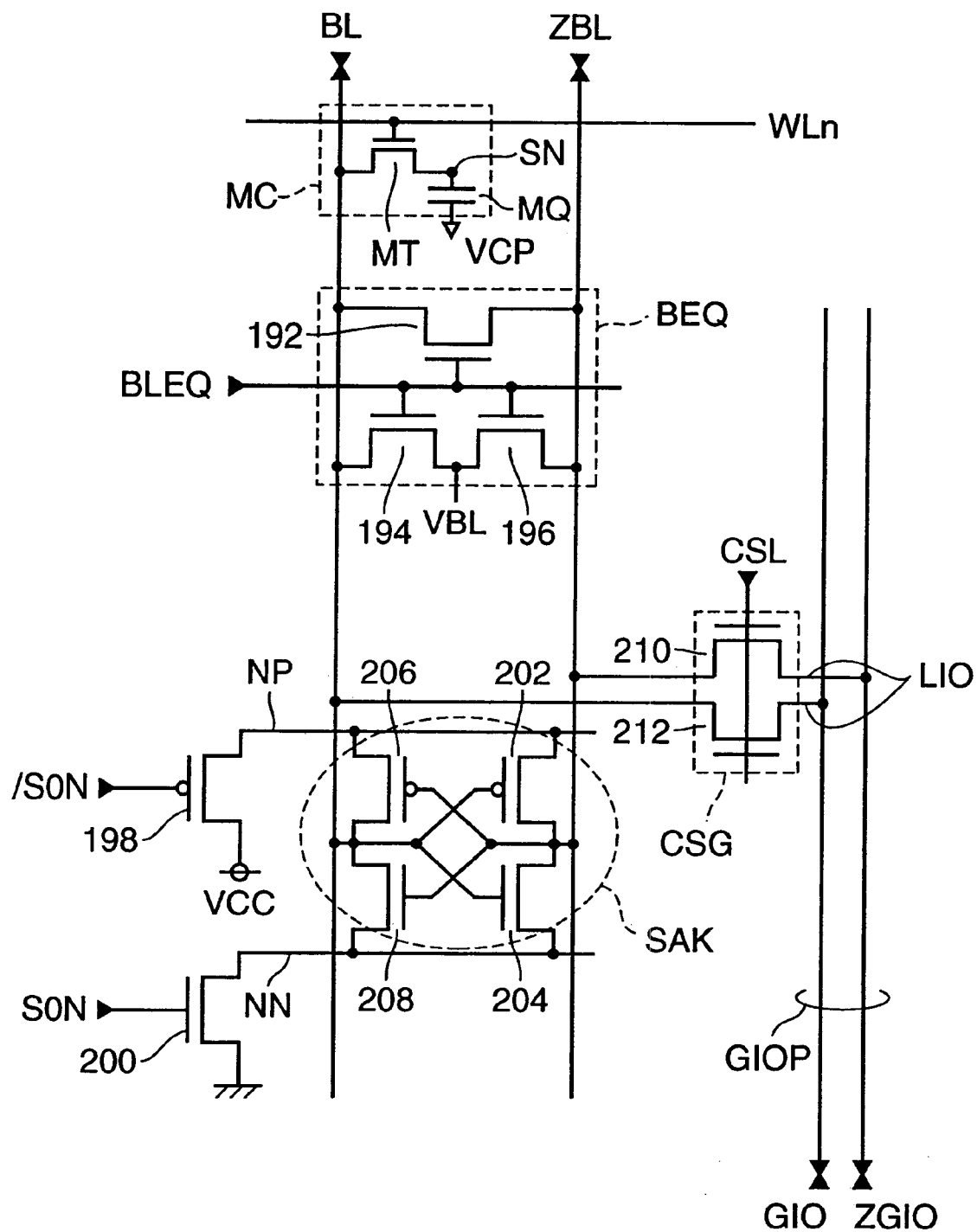
FIG. 6 is a circuit diagram related to a description of a schematic arrangement of a sense amplifier and a memory array in FIG. 1.

FIG. 6 is a circuit diagram related to a description of the schematic arrangement of the sense amplifier and the memory array in FIG. 1.

Referring to FIG. 6, a bit line pair BLP of FIG. 1 included in a memory cell array includes bit lines BL and ZBL. A memory cell MC is disposed at an intersecting portion of one of bit lines BL, ZBL and a word line WLn provided corresponding to each row of memory cells. FIG. 6 shows one representative memory cell.

Memory cell MC is provided between bit line BL and a storage node SN, and includes an N-channel MOS transistor MT having a gate connected to word line WLn, and a capacitor MQ having one end connected to storage node SN and the other end couple to a cell plate potential VCP.

Between bit lines BL and ZBL, an equalize circuit BEQ is further provided for equalizing a potential of bit line BL and a potential of bit line ZBL according to an equalize signal BLEQ.

Equalize circuit BEQ includes an N-channel MOS transistor 192 connected between bit line BL and bit line ZBL for receiving equalize signal BLEQ at a gate, an N-channel MOS transistor 194 connected between a node to which a potential VBL is supplied and bit line BL for receiving equalize signal BLEQ at a gate, and an N-channel MOS transistor 196 connected between the node to which potential VBL is supplied and bit line ZBL for receiving equalize signal BLEQ at a gate.

Between bit lines BL and ZBL, a sense amplifier SAK is further provided which is activated by transistors 200 and 198 respectively rendered conductive according to sense amplifier activating signals S0N and /S0N.

Sense amplifier SAK includes a P-channel MOS transistor 206 and an N-channel MOS transistor 208 connected in series between a node NP and a node NN and having their gates connected to bit line "BL" ZBL, and a P-channel MOS transistor 202 and an N-channel MOS transistor 204 connected in series between node NP and node NN and having their gates connected to bit line "ZBL" BL.

A node connecting P-channel MOS transistor 202 and N-channel MOS transistor 204 is connected to bit line ZBL, and a node connecting P-channel MOS transistor 206 and N-channel MOS transistor 208 is connected to bit line BL. When activated, sense amplifier SAK enlarges the potential difference between bit lines BL, ZBL.

In addition, a column select gate CSG that is rendered conductive in response to a column select signal CSL generated by a column address is provided corresponding to each bit line pair, and consequently, bit lines BL and ZBL are respectively connected to global IO lines GIO and ZGIO via local IO lines LIO during a read operation or a write operation.

Column select gate CSG includes an N-channel MOS transistor 212 connected between bit line BL and a global IO line GIO and having a gate connected to a column select line CSL, and an N-channel MOS transistor 210 connected between bit line ZBL and a global IO line ZGIO and having a gate connected to column select line CSL.

Figure 7:
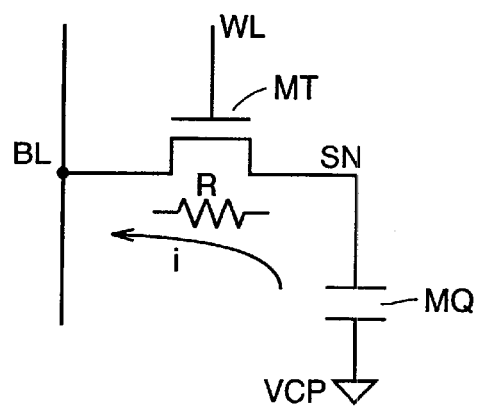
FIG. 7 is a diagram related to a description of how a current flows through a bit line from a memory cell.

FIG. 7 is a diagram related to the description of how a current flows from a memory cell into a bit line.

Referring to FIG. 7, when a memory cell is selected and a corresponding word line WL is activated, a transistor MT is rendered conductive so that charges accumulated in storage node SN are released to bit line BL. At this time, transistor MT has a resistance value R upon conduction.

Figure 8:
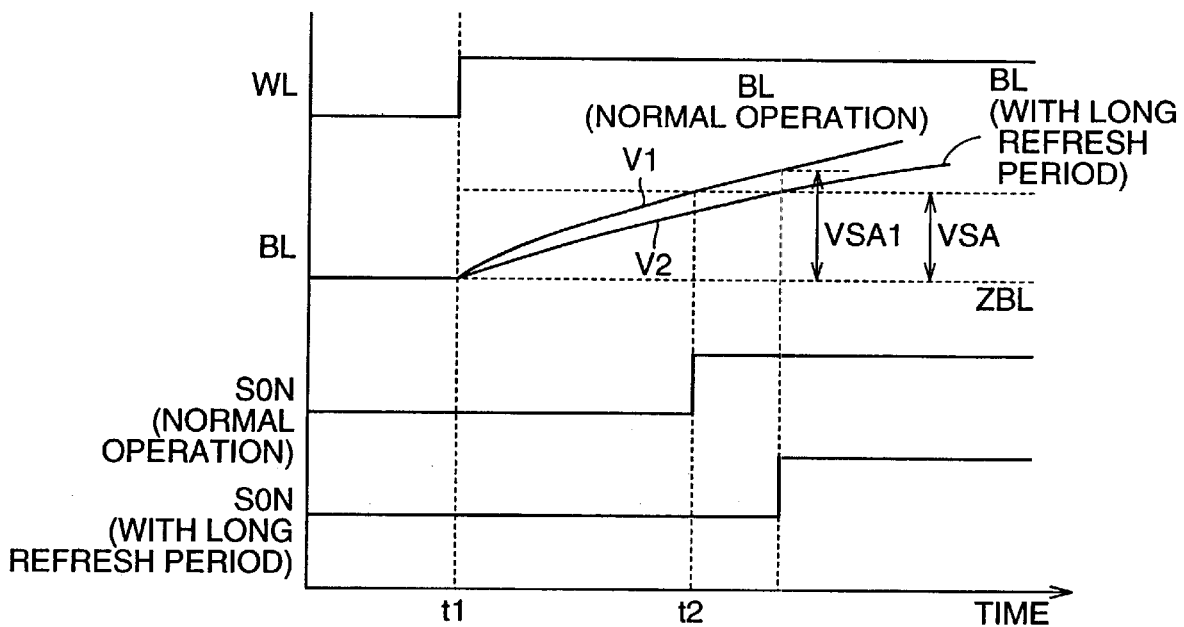
FIG. 8 is an operational waveform chart related to a description of prolonging a refresh period by delaying an activation timing of sense amplifier activating signal S0N.

FIG. 8 is an operational waveform chart related to a description of prolonging a refresh period by delaying an activation timing of sense amplifier activating signal S0N.

Referring to FIGS. 7 and 8, first, during a normal operation, when word line WL is activated at time t1 according to a read operation and the like, a potential V1 of bit line BL rises at time t2, and as a result, the potential difference between bit line BL and bit line ZBL attains a potential difference VSA that allows amplification by a sense amplifier. At this time, by the activation of sense amplifier activating signal S0N, data is read outside the DRAM at a timing that satisfies a prescribed access time.

Thus, if the sense amplifier activation timing is delayed too much, the access time becomes long so that data cannot be read to the outside at a high speed.

When performing a refresh operation, however, the operation need not be restricted by the access time for reading data to the outside so that the sense amplifier activation timing can be delayed until time t3 in relation to a word line activation timing. Consequently, the time period during which a current flows through transistor MT having resistance value R into a bit line becomes long so that the potential difference would increase to VSA1 at time t3.

In other words, when the refresh period is made longer than the time period defined by specification and the charges accumulated in capacitor MQ becomes smaller in amount than during a normal read operation, a potential of bit line BL becomes a potential V2, while the potential of bit line BL is potential V1 during a normal operation. It is indicated, however, that potential difference VSA that allows amplification by a sense amplifier can be ensured at time t3.

Figure 9:
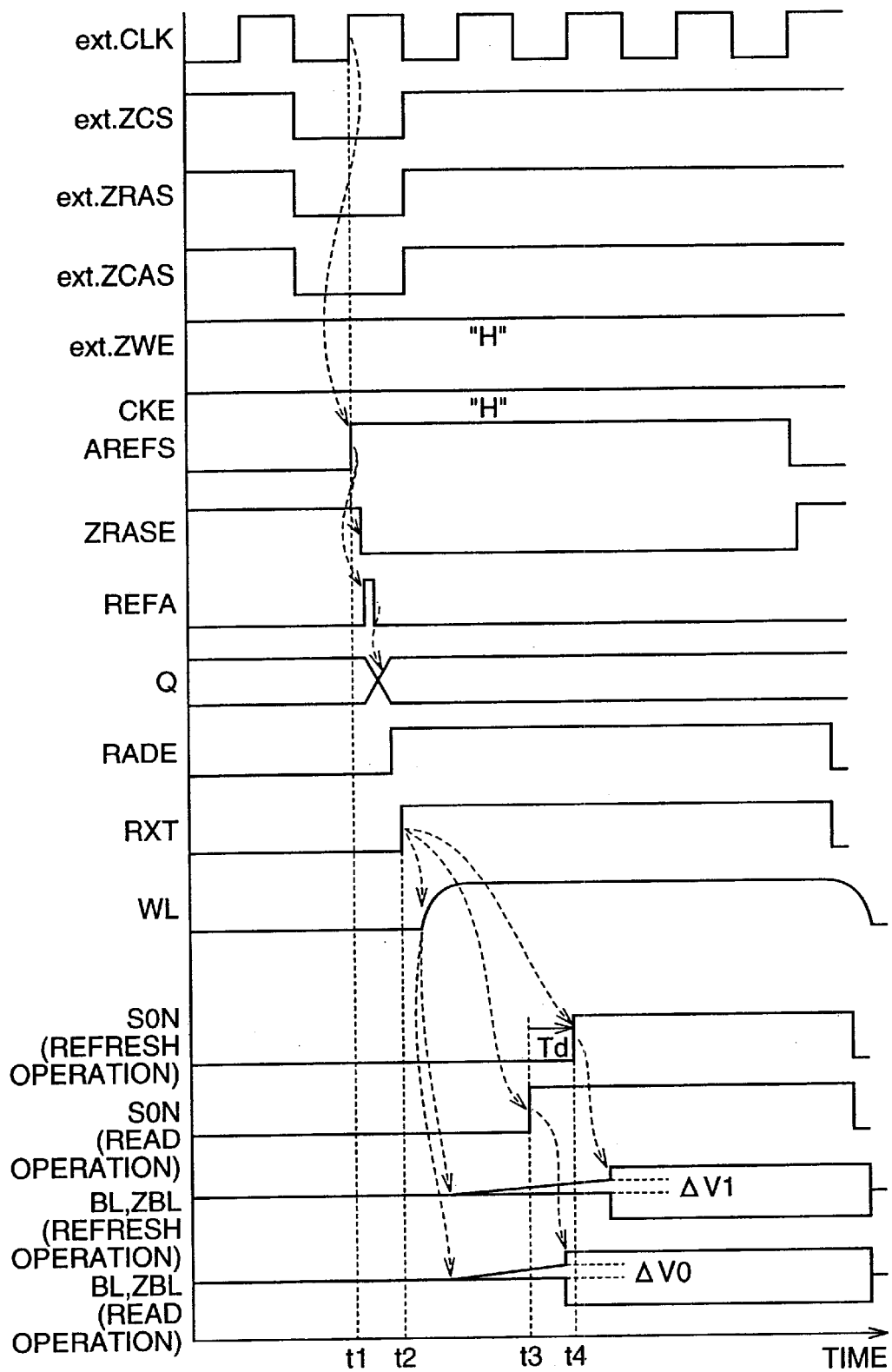
FIG. 9 is an operational waveform chart related to a description of an operation of the semiconductor memory device according to the first embodiment.

FIG. 9 is an operational waveform chart related to a description of an operation of the semiconductor memory device according to the first embodiment.

Referring to FIG. 9, an auto-refresh command is supplied at a rising edge of a clock signal ext.CLK at time t1. At time t1, signals ext.ZCS, ext.ZRAS, and ext.CAS are all set to the L level, while signal ext.ZWE and signal CKE are both set to the H level.

Accordingly, command decode circuit 52 and refresh control unit 54 of FIG. 3 activate signal AREFS and signal ZRASE.

In response to the activation of signal AREFS, 1 shot pulse generating circuit 84 of FIG. 3 outputs a 1 shot pulse as a signal REFA. Then, internal address counter 86 counts an address signal Q.

On the other hand, control circuit 62 of FIG. 3 activates a row address decode signal RADE to the H level according to signal ZRASE and auto-refresh signal AREF, and thereafter at time t2, activates a word line trigger signal RXT to the H level. Accordingly, a word line WL is activated.

When auto-refresh signal AREF is not active, row-related control circuit 64 of FIG. 5 activates a sense amplifier activating signal S0N at time t3 which comes after the delay time of delay stage 164 from the activation of signal RXT at time t2.

When an auto-refresh command is input, however, auto-refresh signal AREF is rendered active so that the activation timing of sense amplifier activating signal S0N is delayed for a delay time Td of delay stage 166 of FIG. 5, and sense amplifier activating signal S0N is activated at time t4. As a result, assuming that the same amount of electric charges is accumulated in the memory cell, a potential difference ΔV1 that is read during the refresh operation becomes greater than a potential difference ΔV0 that is read during the normal operation.

To put it differently, the data refresh by a sense amplifier becomes possible even when the refresh period is set to be longer than that in the conventional example and the accumulated charges of the memory cell are reduced below a prescribed amount.

With the semiconductor memory device according to the first embodiment, as described above, by delaying the sense amplifier activation timing during the refresh operation from that of a normal read operation, the potential difference can be accurately amplified by a sense amplifier even when the accumulated charges in a memory cell becomes small in amount. Thus, the intervals between the refresh operations can be prolonged, and power consumption can be reduced in comparison with the conventional example.

Moreover, the reduction in the power consumption according to the invention of the first embodiment can be achieved during any refresh cycle. Particularly, it is effective during an auto-refresh operation or a self-refresh operation where no access is made from the outside.

Second Embodiment

Figure 10:
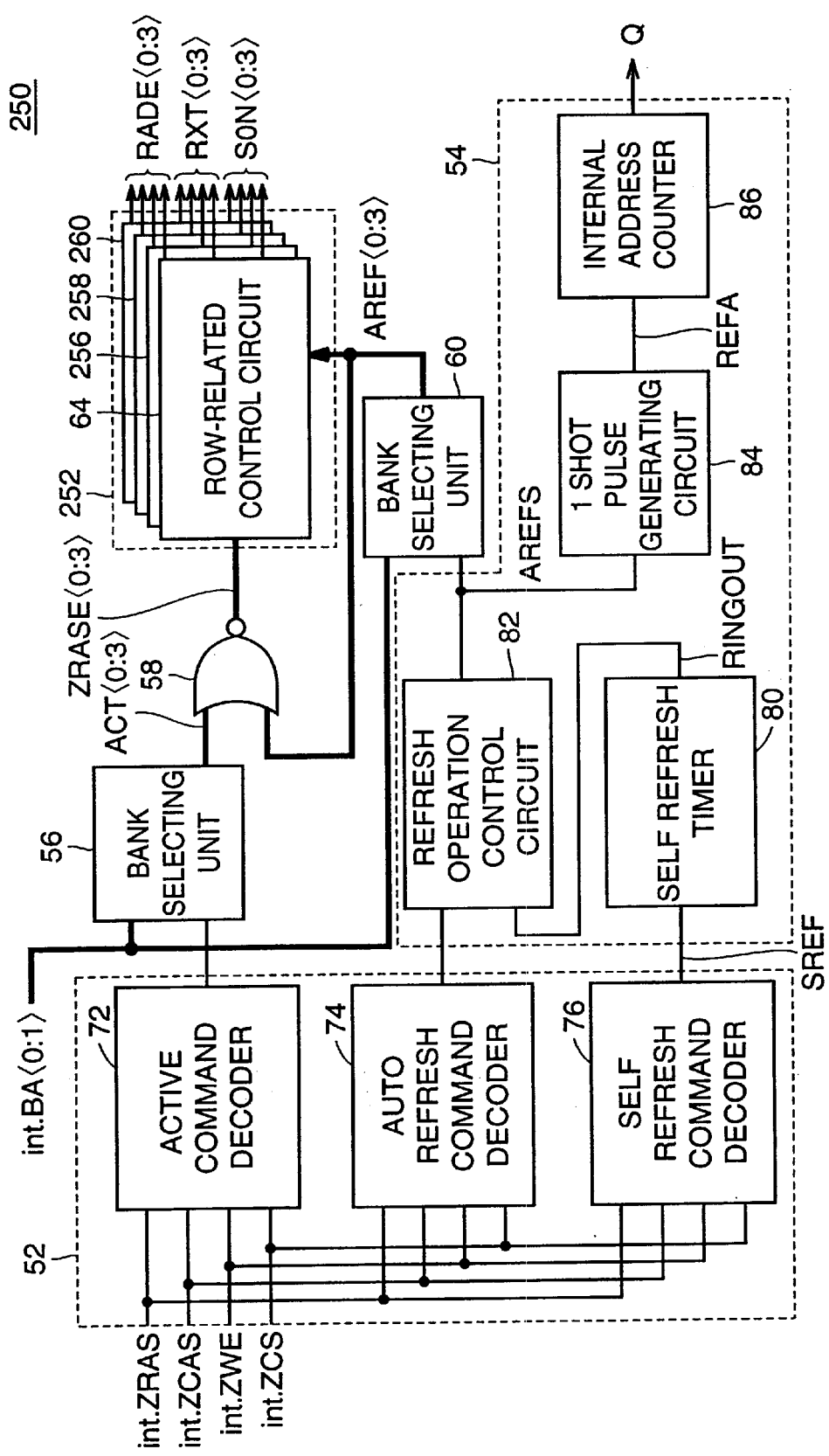
FIG. 10 is a block diagram representing an arrangement of a control circuit 250 used in a semiconductor memory device according to a second embodiment.

FIG. 10 is a block diagram representing an arrangement of a control circuit 250 used in a semiconductor memory device according to the second embodiment.

Referring to FIG. 10, control circuit 250 includes a control circuit 252 in place of control circuit 62 in the arrangement of control circuit 8 shown in FIG. 3. Control circuit 252 includes row-related control circuits 256, 258, and 260 in place of row-related control circuits 66, 68, and 70, respectively, in the arrangement of control circuit 62 in FIG. 3.

The arrangement of other parts of control circuit 250 is the same as that in control circuit 8 so that the description thereof will not be repeated.

Figure 11:
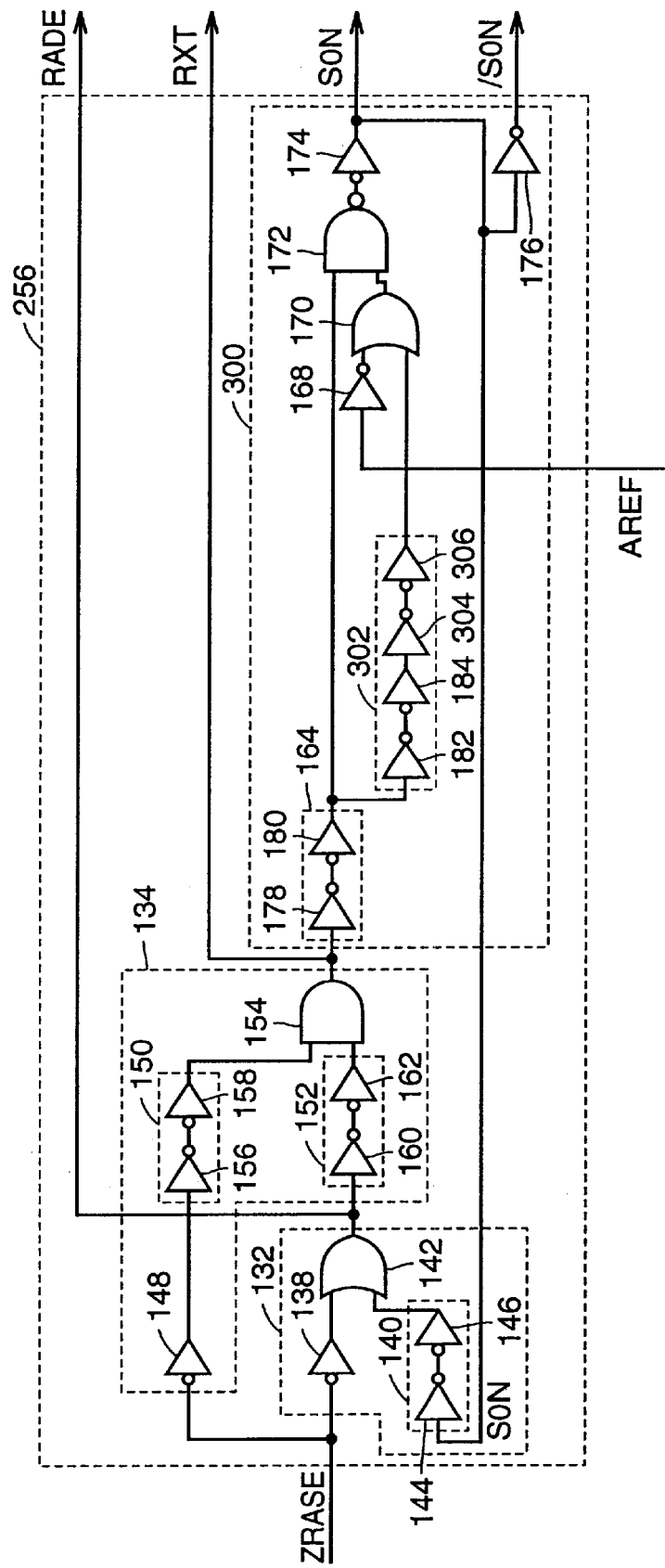
FIG. 11 is a circuit diagram showing an arrangement of a row-related control circuit 256 in FIG. 10.

FIG. 11 is a circuit diagram representing an arrangement of row-related control circuit 256 in FIG. 10.

Referring to FIG. 11, row-related control circuit 256 includes a signal generating unit 300 in place of signal generating unit 136 in the arrangement of row-related control circuit 64 shown in FIG. 5.

Signal generating unit 300 includes a delay stage 302 in place of delay stage 166 in the arrangement of signal generating unit 136. Delay stage 302 includes inverters 304 and 306 connected in series between inverter 184 and OR circuit 170 in the arrangement of delay stage 166. The arrangement in other parts of row-related control circuit 256 is the same as that of row-related control circuit 64 shown in FIG. 5 so that the description thereof will not be repeated.

Figure 12:
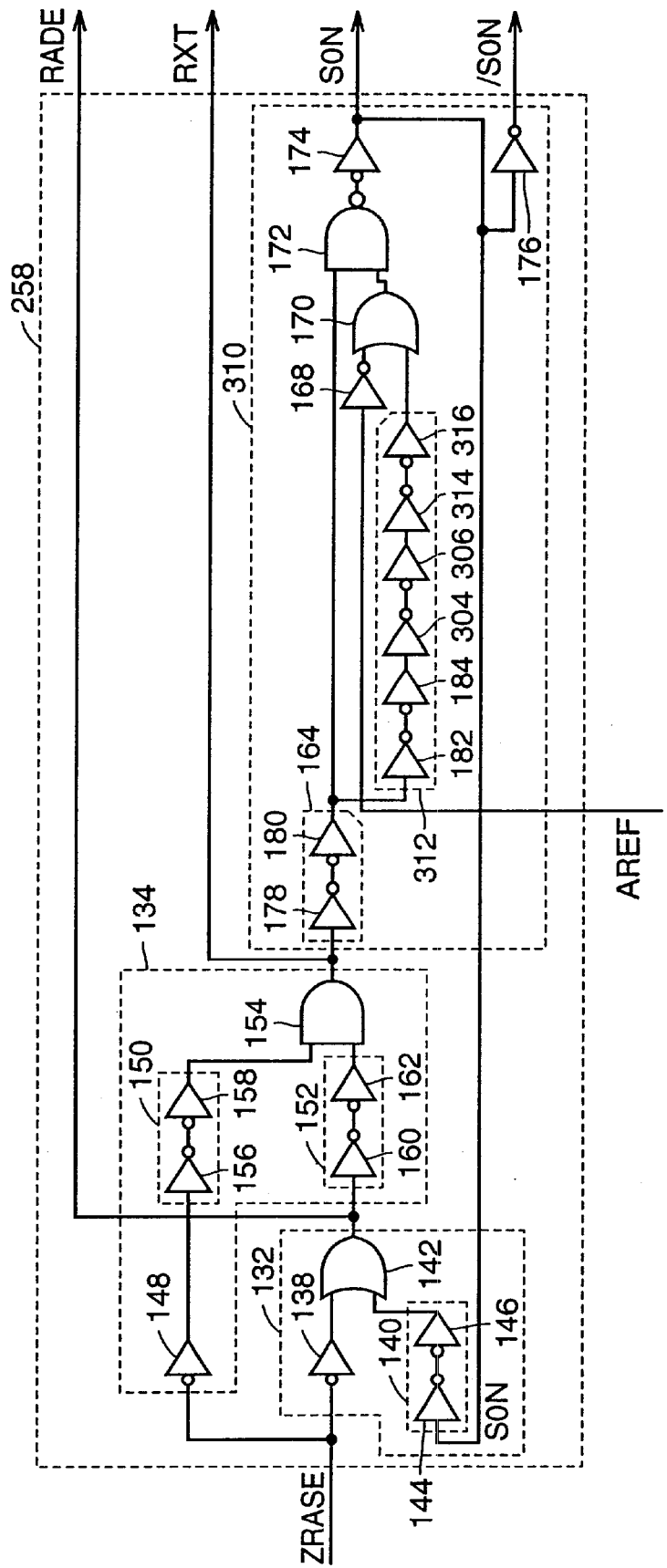
FIG. 12 is a circuit diagram representing an arrangement of a row-related control circuit 258 in FIG. 10.

FIG. 12 is a circuit diagram representing an arrangement of row-related control circuit 258 in FIG. 10.

Referring to FIG. 12, row-related control circuit 258 includes a signal generating unit 310 in place of signal generating unit 300 in the arrangement of row-related control circuit 256 shown in FIG. 11. Signal generating unit 310 includes a delay stage 312 in place of delay stage 302 in the arrangement of signal generating unit 300. Delay stage 312 includes inverters 314 and 316 further connected in series between inverter 306 and OR circuit 170 in the arrangement of delay stage 302.

The arrangement in other parts of row-related control circuit 258 is the same as that of row-related control circuit 256 so that the description will not be repeated.

Figure 13:
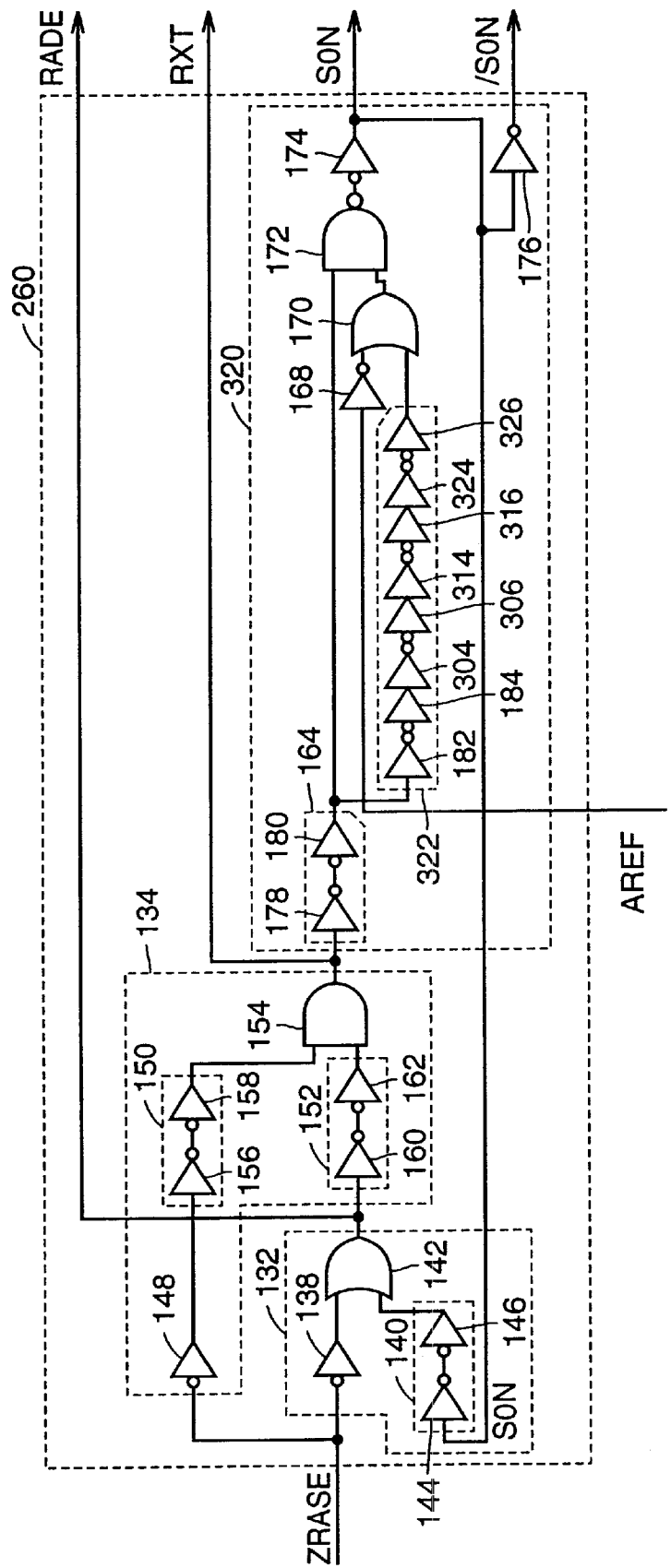
FIG. 13 is a circuit diagram representing an arrangement of a row-related control circuit 260 in FIG. 10.

FIG. 13 is a circuit diagram representing an arrangement of row-related control circuit 260 in FIG. 10.

Referring to FIG. 13, row-related control circuit 260 includes a signal generating unit 320 in place of signal generating unit 310 in the arrangement of row-related control circuit 258 shown in FIG. 12.

Signal generating unit 320 includes a delay stage 322 in place of delay stage 312 in the arrangement of signal generating unit 310.

Delay stage 322 includes inverters 324 and 326 connected in series between inverter 316 and OR circuit 170 in addition to the arrangement of delay stage 312.

The arrangement in other parts of row-related control circuit 260 is the same as that in row-related control circuit 258 shown in FIG. 12 so that the description will not be repeated.

With such an arrangement, delay stage 166, delay stage 302, delay stage 312, and delay stage 322 respectively have different delay times so that, in banks 0 to 3, the timing at which each sense amplifier is activated during a refresh operation would be slightly shifted.

Consequently, as opposed to the case in which the refresh operation is performed for all the banks at the same time, the peak current can be reduced so that power-supply noise can be reduced and the power consumption can be reduced as well.

Third Embodiment

Figure 14:
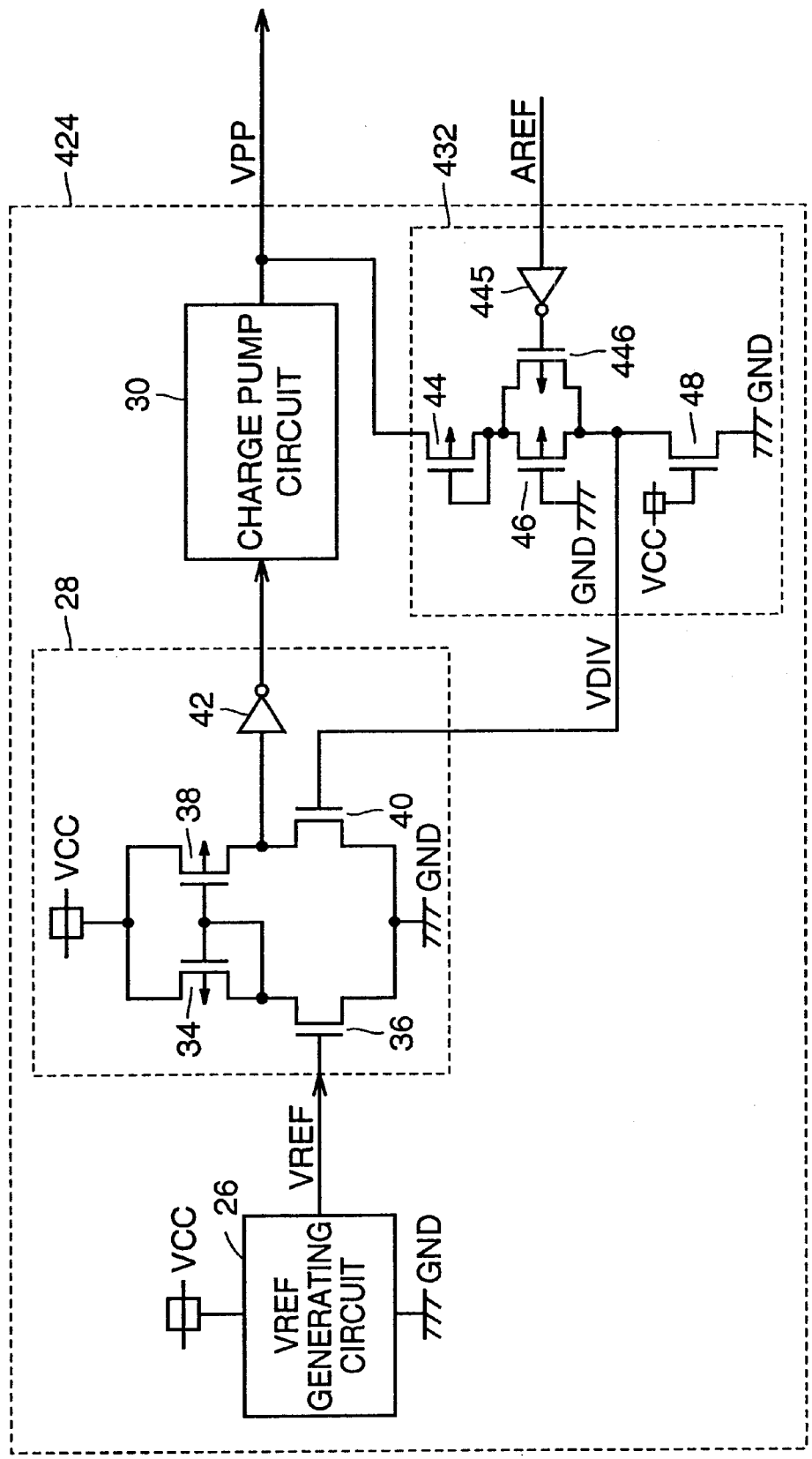
FIG. 14 is a circuit diagram showing an arrangement of a VPP generating circuit 424 used in a third embodiment.
Figure 15:
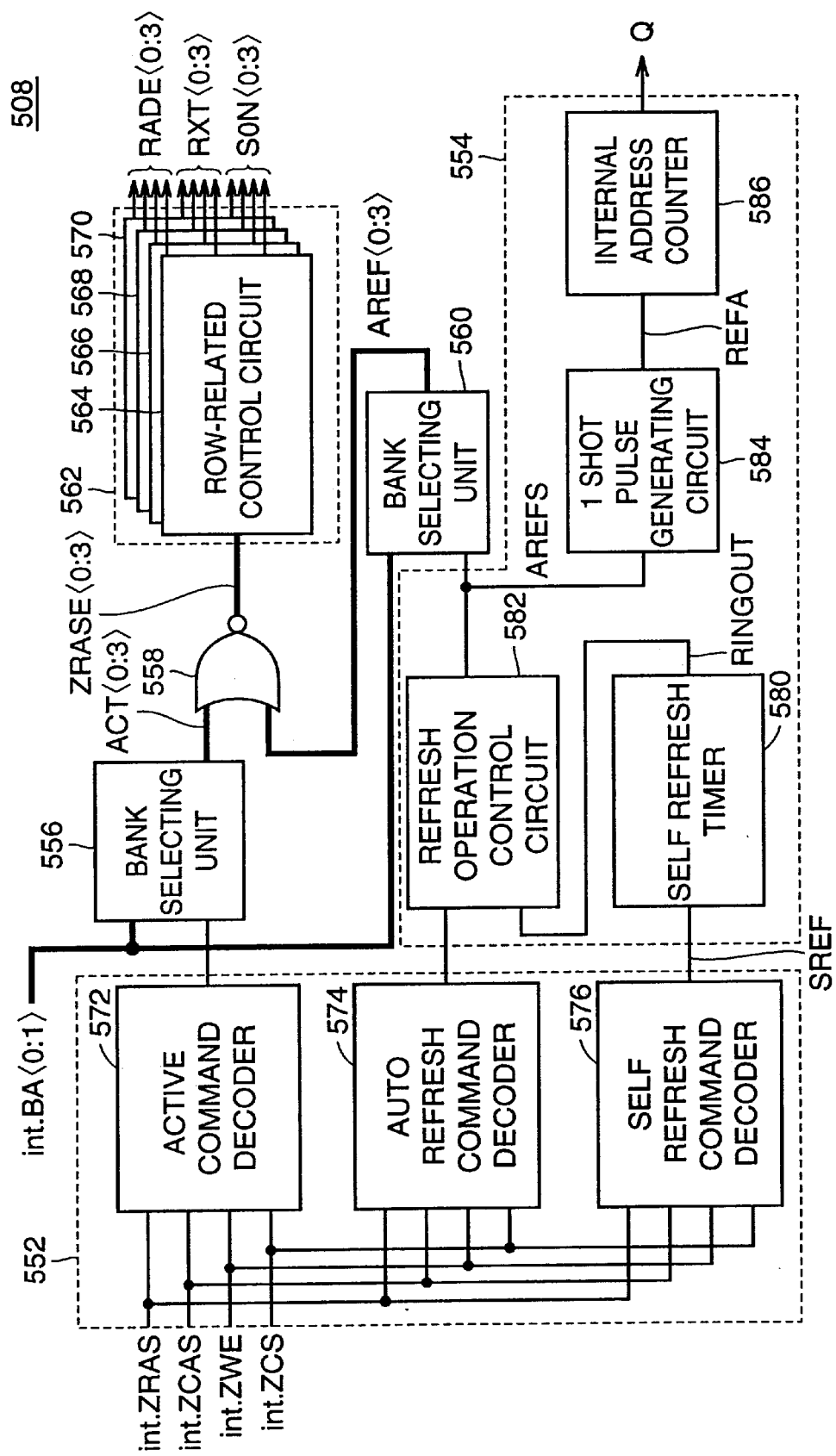
FIG. 15 is a block diagram representing an arrangement of a control circuit 508 for performing row activation timing control of a conventional synchronous DRAM.
Figure 16:
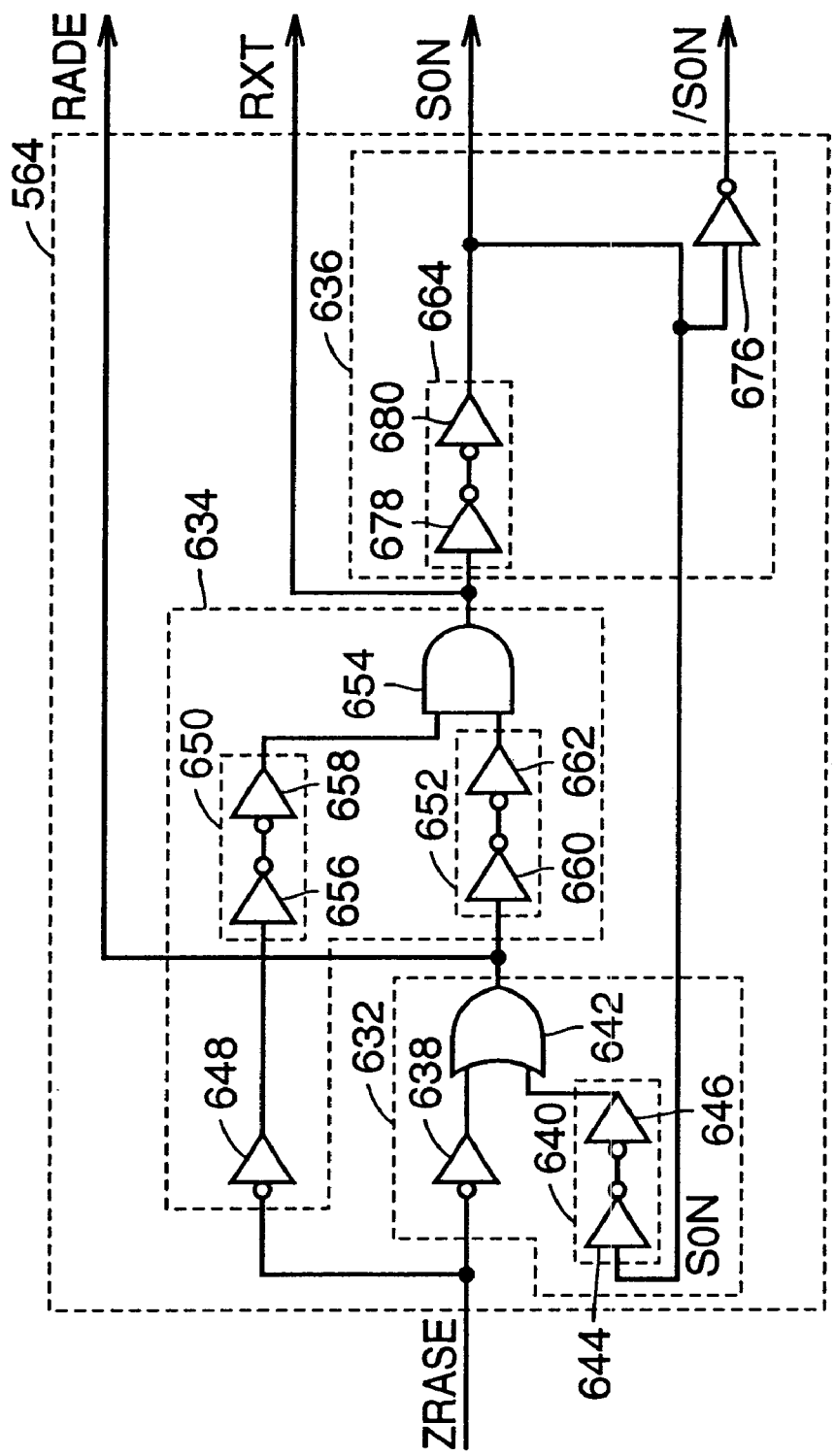
FIG. 16 is a circuit diagram representing an arrangement of a row-related control circuit 564 in FIG. 15.
Figure 17:
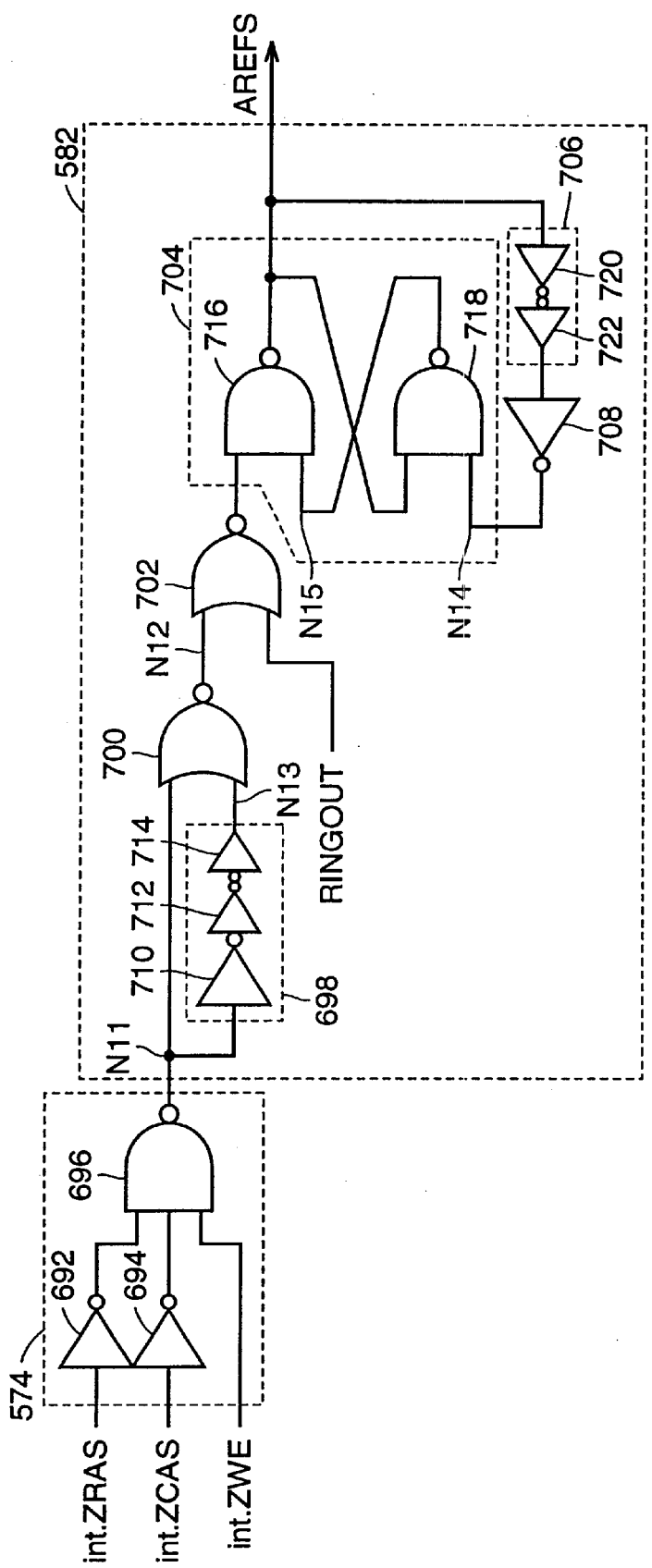
FIG. 17 is a circuit diagram representing an arrangement of an auto-refresh command decoder 574 and a refresh operation control circuit 582 in FIG. 15.
Figure 18:
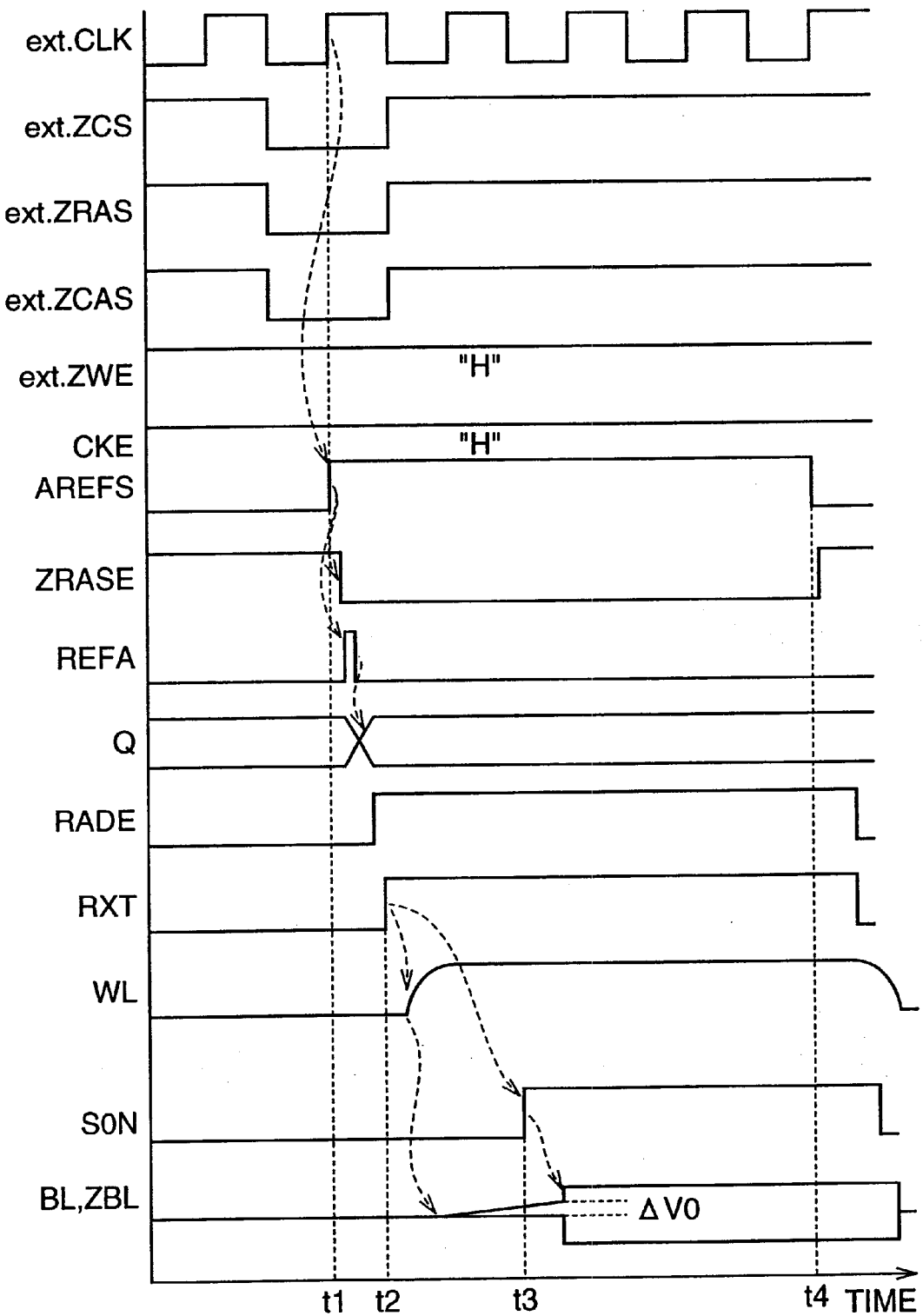
FIG. 18 is an operational waveform chart related to a description of an auto-refresh operation of the conventional DRAM.
Figure 19:
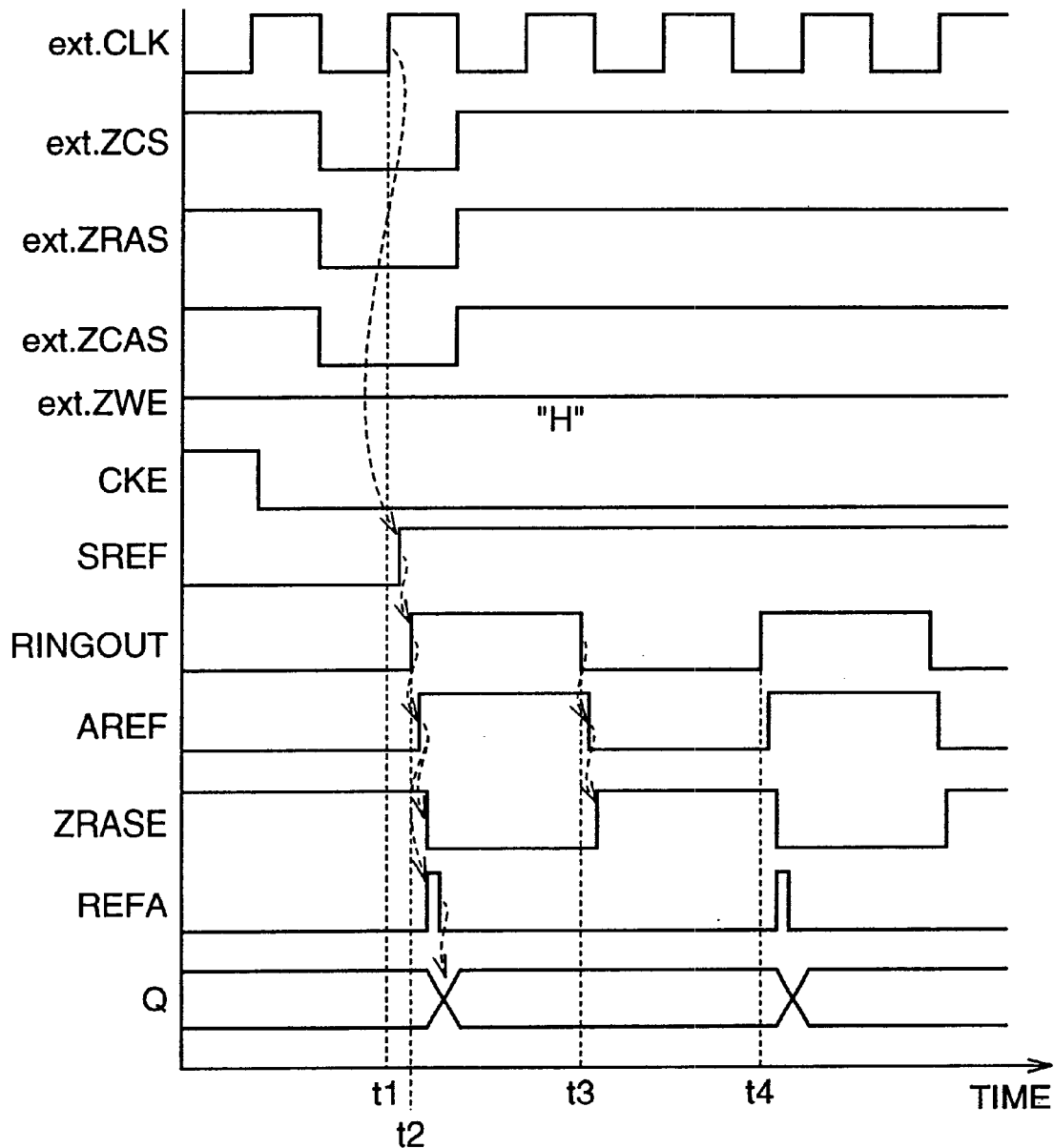
FIG. 19 is an operational waveform chart related to a description of a self-refresh operation of the conventional DRAM.

FIG. 14 is a circuit diagram representing an arrangement of a VPP generating circuit 424 used in the third embodiment.

VPP generating circuit 424 includes a voltage dividing circuit 432 in place of voltage dividing circuit 32 in the arrangement of VPP generating circuit 24 shown in FIG. 2.

Voltage dividing circuit 432 further includes, in addition to the arrangement of voltage dividing circuit 32 shown in FIG. 2, an inverter 445 for receiving and inverting an auto-refresh signal AREF, and a P-channel MOS transistor 446 connected between a source and a drain of P-channel MOS transistor 46 for receiving an output from inverter 445 at a gate.

The arrangement in other parts of VPP generating circuit 424 is the same as that in VPP generating circuit 24 shown in FIG. 2 so that the description will not be repeated.

Now, an operation of VPP generating circuit 424 will be briefly described.

When a normal access is performed, auto-refresh signal AREF is set to the L level so that P-channel MOS transistor 446 is rendered non-conductive, and a potential VPP similar to that of VPP generating circuit 24 shown in FIG. 2 is generated.

Then, when an auto-refresh command or a self-refresh command is supplied and auto-refresh signal AREF attains the H level, P-channel MOS transistor 446 is rendered conductive. Consequently, the resistance value between a source and a drain of P-channel MOS transistor 446 become small so that a divided potential VDIV approaches potential VPP. As a result, potential VPP generated during the refresh operation becomes lower than potential VPP generated during the normal operation. Thus, the power consumption can be reduced by lowering the VPP potential.

When potential VPP is lowered, the activating potential of a word line is lowered so that the potential to be rewritten into capacitor MQ by transistor MT of FIG. 6 is lowered. The degradation of refresh characteristics due to this lowered written potential, however, can be prevented by utilizing the circuit according to the first embodiment with the arrangement according to the third embodiment.

Although the present invention has been described and illustrated in detail, it is dearly understood that the same is by way of illustration and example only and is not to be taken by way of limitation, the spirit and scope of the present invention being limited only by the terms of the appended claims.

What is claimed is:

1. A semiconductor memory device, comprising:
a memory block including a plurality of memory cells arranged in a matrix of rows and columns, wherein
said memory block includes
a plurality of word lines corresponding to said rows,
a plurality of bit line pairs corresponding to said columns,
a row decode circuit for selectively activating a part of said plurality of word lines,
a column decode circuit for selecting a part of said plurality of bit line pairs, and
a sense amplifier circuit for amplifying data read on said plurality of bit lines, said semiconductor memory device further comprising:
a control circuit for controlling said row decode circuit and said sense amplifier circuit, wherein
said control circuit includes
a command decode circuit for detecting a plurality of commands from a control signal externally supplied, and
a row activation timing control unit for outputting a first activating signal that indicates an activation timing of said word lines and a second activating signal that indicates an activation timing of said sense amplifier circuit according to an output from said command decode circuit, and wherein
said row activation timing control unit activates said first activating signal, and after a first delay time, activates said second activating signal when a command detected by said command decode circuit is a first command, and activates said first activating signal, and after a second delay time longer than said first delay time, activates said second activating signal when the command detected by said command decode circuit is a second command.

2. The semiconductor memory device according to claim 1, wherein
said row activation timing control unit includes
a first signal generating unit for activating said first activating signal according to said first and second commands, and
a second signal generating unit for delaying, for said first delay time, an output from said first signal generating unit when the command detected by said command decode circuit is said first command and delaying, for said second delay time, the output from said first signal generating unit when the command detected by said command decode circuit is said second command, and outputting said second activating signal.

3. The semiconductor memory device according to claim 2, wherein
said second signal generating unit includes
a first delay circuit for receiving the output from said first signal generating unit and delaying the received output for said first delay time,
a second delay circuit for receiving an output from said first delay circuit and further delaying the received output for a time period which is a difference between said second delay time and said first delay time, and
a selecting circuit for selecting one of outputs from said first and second delay circuits according to the command detected by said command decode circuit and outputting said second activating signal.

4. The semiconductor memory device according to claim 1, wherein
said first command is a row activation command, and
said second command is an auto-refresh command.

5. The semiconductor memory device according to claim 4, wherein
said command decode circuit includes a command decoder for detecting said auto-refresh command, and
said control circuit includes
a refresh control circuit for instructing start of a refresh operation according to an output from said command decoder, and
a counter circuit for generating a refresh address according to an output from said refresh control circuit.

6. The semiconductor memory device according to claim 1, wherein
said first command is a row activation command, and
said second command is a self-refresh command.

7. The semiconductor memory device according to claim 6, wherein
said command decode circuit includes a command decoder for detecting said self-refresh command, and
said control circuit includes
a timer circuit for periodically instructing start of a refresh operation according to an output from said command decoder, and
a counter circuit for generating a refresh address according to an output from said timer circuit.

8. The semiconductor memory device according to claim 1, further comprising:
a potential generating circuit for generating an activating potential of said word lines, wherein
said potential generating circuit generates a first potential as said activating potential in order to execute said first command, and generates a second potential lower than said first potential as said activating potential according to said second command.

9. The semiconductor memory device according to claim 8, wherein
said potential generating circuit includes
a reference potential generating circuit for generating a reference potential,
a comparing circuit for comparing said reference potential and a divided potential,
a charge pump circuit for performing a boosting operation and outputting said activating potential according to an output from said comparing circuit, and
a voltage dividing circuit for down-converting said activating potential according to said second command and outputting said divided potential.

10. A semiconductor memory device, comprising:
a plurality of memory blocks, wherein
each of said plurality of memory blocks includes
a plurality of memory cells arranged in a matrix of rows and columns,
a plurality of word lines corresponding to said rows,
a plurality of bit line pairs corresponding to said columns,
a row decode circuit for selectively activating a part of said plurality of word lines,
a column decode circuit for selecting a part of said plurality of bit line pairs, and
a sense amplifier circuit for amplifying data read on said plurality of bit lines; said semiconductor memory device further comprising:
a control circuit for controlling said row decode circuit and said sense amplifier circuit, wherein said control circuit includes
- a command decode circuit for detecting a plurality of commands from a control signal externally supplied, and
- a plurality of row activation timing control units provided corresponding to said plurality of memory blocks for outputting a first activating signal that indicates an activation timing of said word lines and a second activating signal that indicates an activation timing of said sense amplifier circuit according to an output from said command decode circuit, wherein
- each of said plurality of row activation timing control units activates said first activating signal, and after a first delay time, activates said second activating signal when a command detected by said command decode circuit is a first command, and activates said first activating signal, and after a time period that is longer than said first delay time, activates said second activating signal when the command detected by said command decode circuit is a second command, and
- time period from activation of said first activating signal to activation of said second activating signal according to said second command varies for said plurality of row activation timing control units.

11. The semiconductor memory device according to claim 10, wherein
each of said plurality of row activation timing control units includes
- a first signal generating unit for activating said first activating signal according to said first and second commands, and
- a second signal generating unit for delaying, for said first delay time, an output from said first signal generating unit when the command detected by said command decode circuit is said first command and delaying, for a time period longer than said first delay time, the output from said first signal generating unit when the command detected by said command decode circuit is said second command, and outputting said second activating signal.

12. The semiconductor memory device according to claim 11, wherein
said second signal generating unit includes
- a first delay circuit for receiving the output from said first signal generating unit and delaying the received output for said first delay time,
- a second delay circuit for receiving an output from said first delay circuit and further delaying the received output, and
- a selecting circuit for selecting one of outputs from said first and second delay circuits according to the command detected by said command decode circuit and outputting said second activating signal, wherein
delay time of said second delay circuit corresponding to said plurality of row activation timing control units varies.

13. The semiconductor memory device according to claim 10, wherein
said plurality of memory blocks are memory banks that can perform a read operation independently of one another.

14. The semiconductor memory device according to claim 10, wherein
said first command is a row activation command, and
said second command is an auto-refresh command.

15. The semiconductor memory device according to claim 14, wherein
said command decode circuit includes a command decoder for detecting said auto-refresh command, and
said control circuit includes
- a refresh control circuit for instructing start of a refresh operation according to the output from said command decoder, and
- a counter circuit for generating a refresh address according to an output from said refresh control circuit.

16. The semiconductor memory device according to claim 10, wherein
said first command is a row activation command, and
said second command is a self-refresh command.

17. The semiconductor memory device according to claim 16, wherein
said command decode circuit includes a command decoder for detecting said self-refresh command, and
said control circuit includes
- a timer circuit for periodically instructing start of a refresh operation according to the output from said command decoder, and
- a counter circuit for generating a refresh address according to an output from said timer circuit.

* * * * *

UNITED STATES PATENT AND TRADEMARK OFFICE
CERTIFICATE OF CORRECTION

PATENT NO.     : 6,504,787 B2
DATED          : January 7, 2003
INVENTOR(S)    : Yayoi Tsubouchi et al.

It is certified that error appears in the above-identified patent and that said Letters Patent is hereby corrected as shown below:

<u>Column 11,</u>
Line 31, delete ""BL""
Line 34, delete ""ZBL""

Signed and Sealed this

Twenty-eighth Day of October, 2003

JAMES E. ROGAN
*Director of the United States Patent and Trademark Office*